(12) United States Patent
Nguyen et al.

(10) Patent No.: US 12,328,839 B2
(45) Date of Patent: Jun. 10, 2025

(54) MODULAR REAR PANEL SYSTEM FOR CHASSIS OF ELECTRONIC DEVICE

(71) Applicant: HEWLETT PACKARD ENTERPRISE DEVELOPMENT LP, Spring, TX (US)

(72) Inventors: Minh H. Nguyen, Fort Collins, CO (US); Earl W. Moore, Tomball, TX (US); Keith Allen Sauer, Spring, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 200 days.

(21) Appl. No.: 18/309,207

(22) Filed: Apr. 28, 2023

(65) Prior Publication Data
US 2024/0365499 A1 Oct. 31, 2024

(51) Int. Cl.
*H05K 7/14* (2006.01)
*H05K 5/02* (2006.01)
*H05K 7/18* (2006.01)

(52) U.S. Cl.
CPC ......... *H05K 7/1489* (2013.01); *H05K 5/0217* (2013.01); *H05K 7/18* (2013.01)

(58) Field of Classification Search
CPC ....... H05K 5/0217; H05K 7/1489; H05K 7/18
See application file for complete search history.

(56) References Cited

U.S. PATENT DOCUMENTS

| | | | | |
|---|---|---|---|---|
| 5,831,821 | A * | 11/1998 | Scholder | H05K 7/1429 361/679.58 |
| 8,585,442 | B2 * | 11/2013 | Tuma | G06F 1/185 361/737 |
| 8,797,764 | B2 * | 8/2014 | Bohannon | H05K 7/1489 361/810 |
| 10,398,056 | B1 * | 8/2019 | Bryan | B25J 9/1661 |
| 11,191,176 | B1 * | 11/2021 | Chen | H05K 7/1445 |
| 2007/0144983 | A1 * | 6/2007 | Fan | H05K 7/1424 211/26 |
| 2018/0077815 | A1 | 3/2018 | Schulze et al. | |
| 2018/0167268 | A1 | 6/2018 | Liguori et al. | |

(Continued)

FOREIGN PATENT DOCUMENTS

CN 216210806 U 4/2022

*Primary Examiner* — Daniel J Rohrhoff
(74) *Attorney, Agent, or Firm* — Jones Robb PLLC

(57) ABSTRACT

A modular rear panel system for a chassis of an electronic device includes modular brackets and modular rear panel sections. The brackets are each configured to be selectively coupled to the chassis at a corresponding one of multiple bracket mounting locations. The rear panel sections are each configured to be selectively coupled to one or more corresponding ones of the modular brackets. The brackets and the plurality of rear panel sections comprise, i.e., can be grouped into, multiple different combinations, with each combination comprising a subset of the rear panel sections and subset of the brackets that can be assembled together to form a rear panel of the chassis, with the subset of brackets coupled to the mounting locations and the subset of rear panel sections coupled to the subset of brackets. The respective rear panels formable by the plurality of combinations have mutually different rear panel configurations.

20 Claims, 17 Drawing Sheets

(56) References Cited

U.S. PATENT DOCUMENTS

| | | | |
|---|---|---|---|
| 2023/0275444 A1* | 8/2023 | Reeder | H05K 5/0204 320/107 |
| 2024/0222943 A1* | 7/2024 | Anekal Venkataramanappa | H02B 1/24 |

* cited by examiner

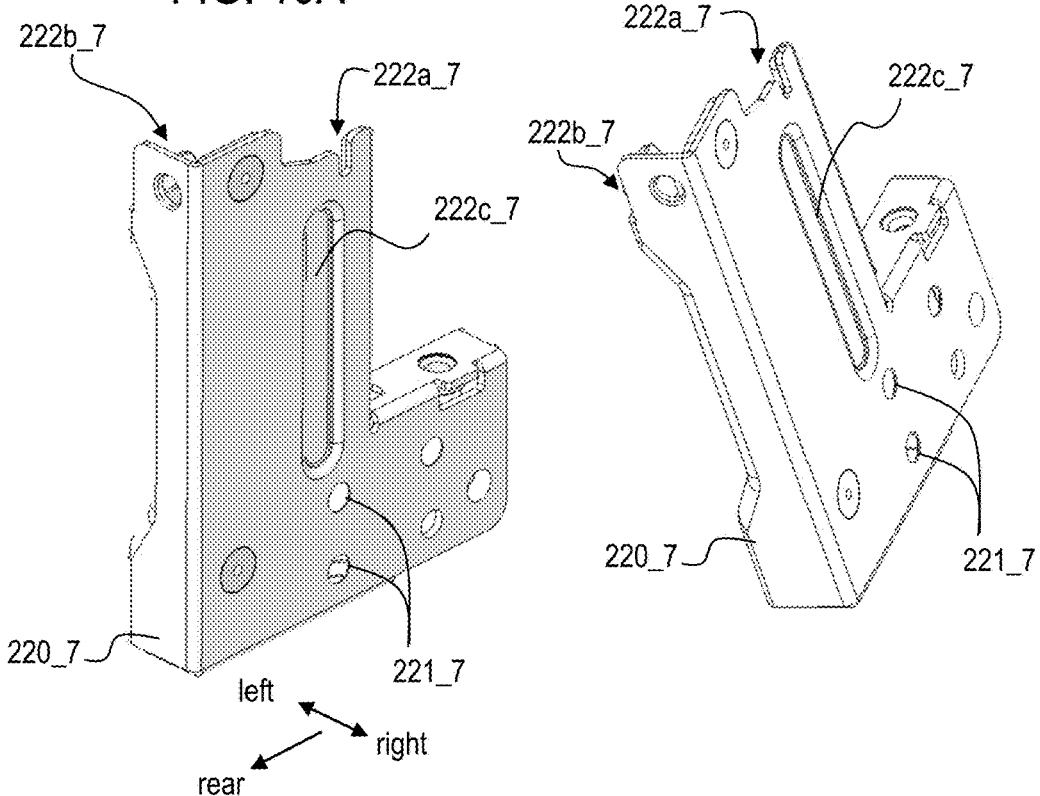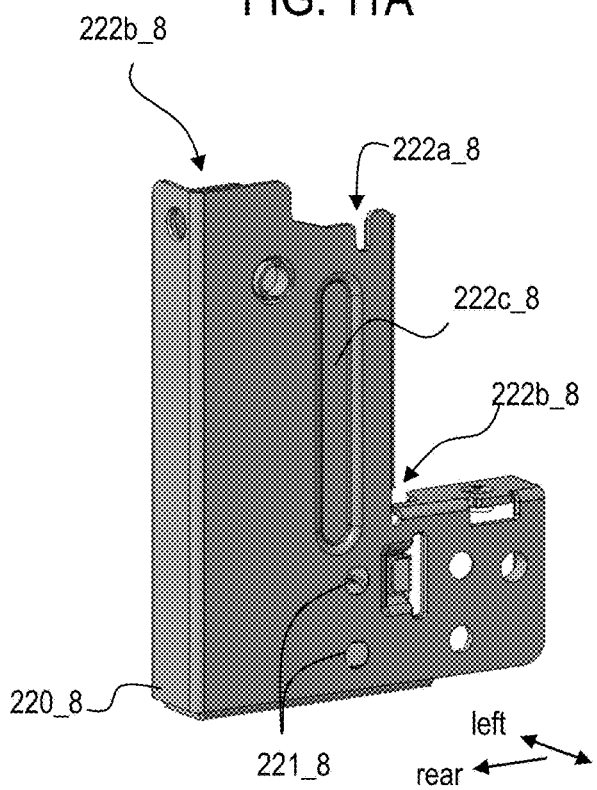

MODULAR REAR PANEL SYSTEM FOR CHASSIS OF ELECTRONIC DEVICE

INTRODUCTION

In many electronic systems, such as servers and networking devices, the electronic components of the system (e.g., processors, memory, storage drives, etc.) are enclosed in and/or supported by a mechanical structure, referred to as a chassis. A chassis typically includes a base, lateral walls, a rear panel, a front section, and a top cover. The base, lateral walls, and top cover generally comprise relatively solid walls, whereas the front section and the rear panel may have more specialized and/or heterogenous structures to allow for various functionalities. For example, in some chassis, the front section may comprise a cage comprising bays for holding removable components (e.g., hot-swappable storage drives). Furthermore, the rear panel usually comprises multiple sections that are coupled together and serve a variety of different purposes, such as additional cages for removable devices, expansion card slots, perforated wall sections to allow air to flow therethrough for cooling, input/output sections comprising apertures and/or support members for connectors of the electronic components (e.g., for connecting with power and communication cables), or other sections. The assembly of these sections may be referred to collectively herein as a rear panel, although it is not necessarily formed from a single homogenous panel.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operation. In the drawings:

FIG. 10A is a perspective view of another modular bracket of the example modular rear panel system of FIG. 3. FIG. 10B is another perspective view of the bracket of FIG. 10A.

FIG. 11A is a perspective view of another modular bracket of the example modular rear panel system of FIG. 3. FIG. 11B is another perspective view of the bracket of FIG. 11A.

DETAILED DESCRIPTION

Figure 1:
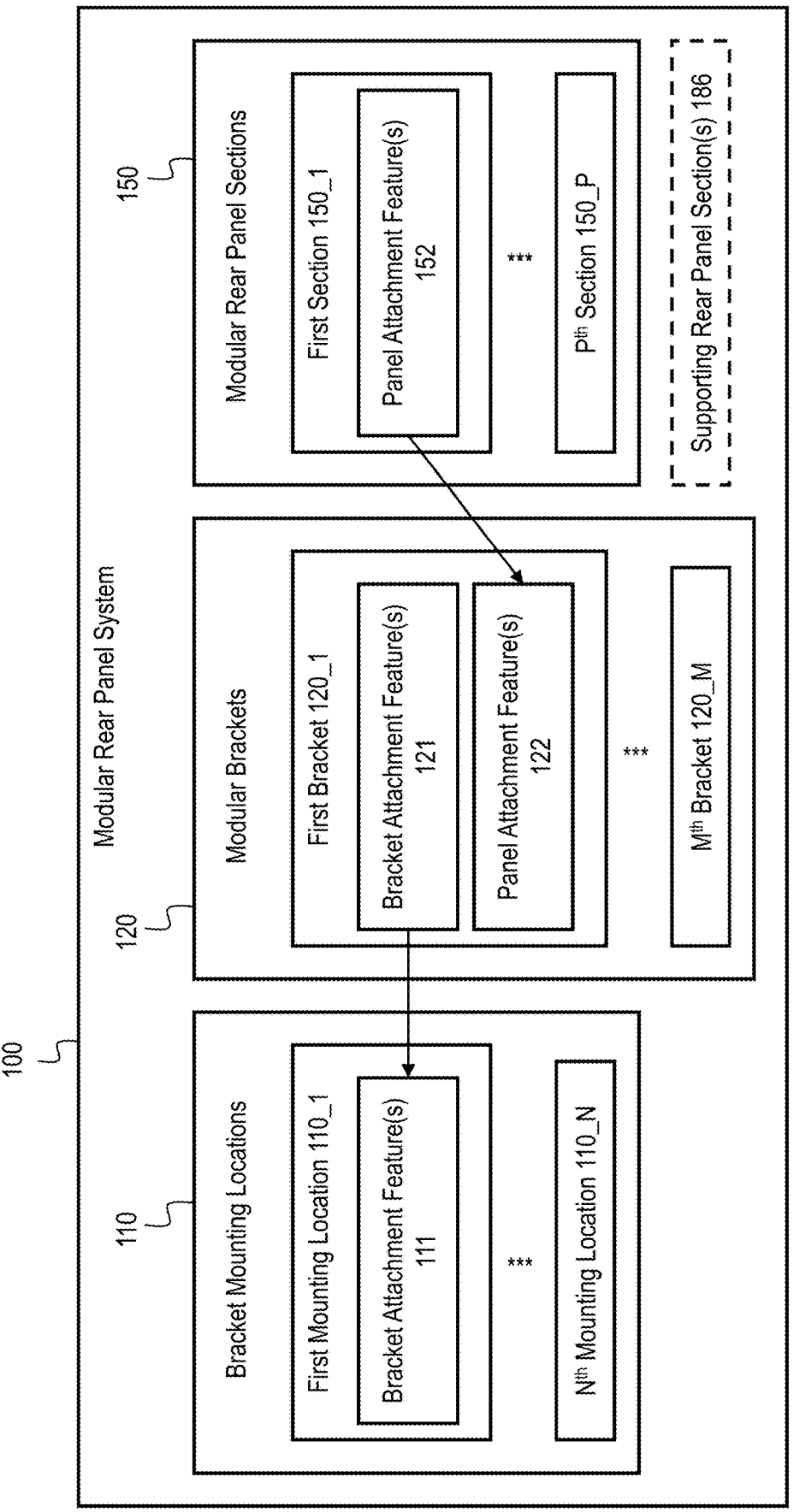
FIG. 1 is a block diagram illustrating an example modular rear panel system for forming a rear panel of a chassis of an electronic device.

Generally, different electronic systems may utilize different chassis, and the chassis of one system may not be usable with another electronic system (or vice versa). More specifically, the configuration of the rear panel of the chassis may vary from one electronic system to the next. This variation in the rear panel configuration between systems may occur because the different systems may have different configurations of electrical components, and the rear panel is generally designed to accommodate a specific configuration of electronic components. For example, different rear panels may have different numbers, types, and locations of apertures for receiving connectors of the electronic components depending on which electrical components are included in the system and where those components are positioned in the system. As another example, a given type of system may be configurable by a user at purchase to include various optional features, some of which may be positioned at the rear panel, and thus the rear panel that is used for the system may vary depending on which optional features are selected. For instance, one configuration of the system may have a rear panel that comprises expansion card slots to allow a set of expansion cards to be installed in the system, whereas another configuration of the system may have a rear panel with a bay for receiving storage drives in the same location where the expansion card slots were located in the other configuration. Thus, even electronic systems that share the same basic architecture, such as two configurations of the same type of server but having different optional features installed, may require different rear panel configurations.

Consequently, a manufacturer of electronic systems may need to design and produce many different types of chassis, both for the various different systems they produce and also potentially for each of the different optional configurations of those systems. This proliferation of different types of chassis can be costly and wasteful. Designing multiple different types of chassis for different systems can increase development time and costs. In addition, because each chassis is different, each may require a different stock-keeping-unit (SKU), which can increase logistical and storage costs. Furthermore, changes to a configuration of an electronic system after its manufacture may be more costly, as an entirely different chassis (or at the very least an entirely different rear panel) may need to be obtained in order to accommodate the change in configuration.

To address these issues, modular rear panel systems are disclosed herein, wherein a single modular rear panel system can be used to form the rear panel of the chassis for multiple differently configured electronic systems, such as multiple differently configured servers having mutually different combinations of electronic components. In particular, each modular rear panel can be selectively configured (or reconfigured) into multiple different rear panel configurations to accommodate multiple different configurations of the electronic components. Thus, if a given electronic system is to be produced, a rear panel that matches the particular configuration of electronic components of the system can be created out of the modular rear panel system, and if a different electronic system having a different configuration of electronic components is to be produced, a different rear panel that matches the different configuration of electronic components can be created out of the same modular rear panel system. In this manner, a single type of modular rear panel system can be used to produce multiple differently configured rear panels for different electronic systems. Thus, instead of having to design and manufacture separate rear panels for each system (or for each variation of a given system), a single modular rear panel system can be designed and manufactured and then different configurations of rear panel can be assembled therefrom as needed, thus saving on development time and production costs. In addition, systems can have their configuration changed post manufacture (e.g., a field upgrade) by replacing one of more rear panel sections and corresponding brackets.

The modular rear panel system may comprise a plurality of brackets and a plurality of rear panel sections, with the brackets and rear panel sections being modules of the modular rear panel section. Some or all of the modular rear panel sections may correspond to different types of electronic components and may be configured to house or otherwise facilitate use of those electronic components in a system (e.g., a given rear panel section could include a cage to house certain electronic components). The brackets can be coupled to the remainder of the chassis (e.g., to the base, top, and/or lateral walls) at a plurality of predetermined bracket mounting locations. Each bracket corresponds to one or more of the rear panel sections and has attachment features that allow the corresponding rear panel section to be attached to the bracket. Thus, if a given bracket is attached to the chassis and the corresponding rear panel section is attached to the bracket, the bracket can physically support the rear panel section and secure the rear panel section to the remainder of the chassis (the rear panel section is not necessarily supported or secured solely by the bracket, but the bracket may contribute to the support and securing of the rear panel section). In addition, in some examples, multiple different brackets can be selectively and interchangeably installed at a given bracket mounting location (one at a time), and therefore different rear panel sections can be installed at various different positions along the rear panel by selecting the appropriate brackets and coupling them to the appropriate bracket attachment points. For example, if a given configuration of the rear panel calls for a given rear panel section to be installed at a given location, then this can be achieved by selecting one of the brackets that corresponds to the given rear panel section, attaching the bracket to a corresponding one of the bracket mounting locations adjacent to the desired installation position for the given rear panel section, and then attaching the given rear panel section to the bracket. This selection and attachment process be repeated for each desired rear panel section of a given configuration, and in this manner different configurations of rear panel can be achieved using different combinations of the modular rear panel sections and modular brackets. In other words, the modular brackets and modular rear panel sections can be grouped into multiple mutually different combinations, with each combination comprising a subset of the brackets and a subset of the rear panel sections, and these combinations can each be assembled into mutually different rear panels. This allows for a variety of different configurations of rear panels to be created using the same modular rear panel system by appropriately selecting and arranging the brackets and rear panel sections.

Turning now to the figures, various devices, systems, and methods in accordance with aspects of the present disclosure will be described.

Figure 2:
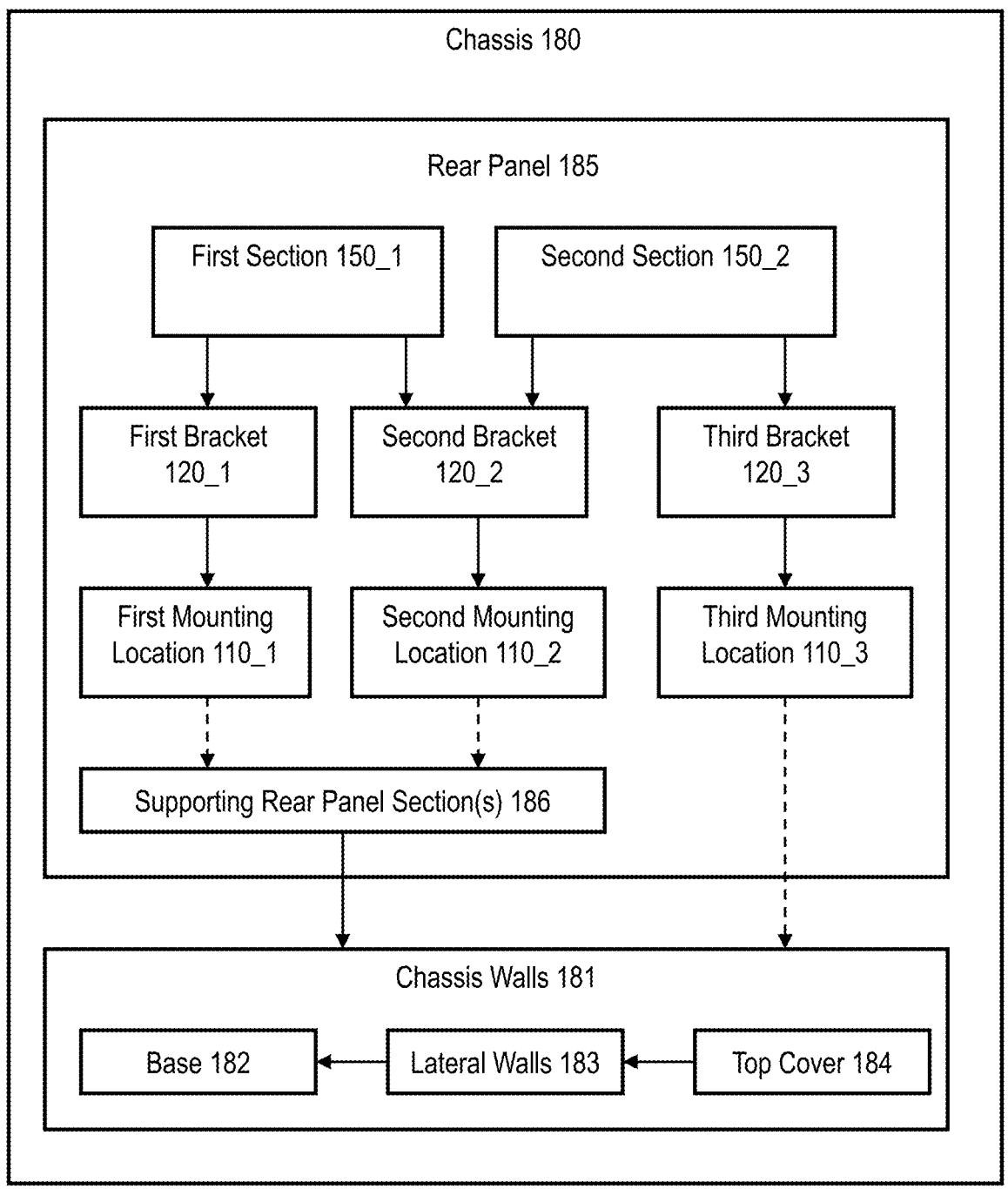
FIG. 2 comprises block diagram illustrating an example chassis of an electronic device having a rear panel formed from the modular rear panel system of FIG. 1.

FIGS. 1 and 2 are block diagrams conceptually illustrating a modular rear panel system 100 and a chassis 180 of an electronic system, respectively. It should be understood that FIGS. 1 and 2 are not intended to illustrate specific shapes, dimensions, or other structural details accurately or to scale, and that implementations of the modular rear panel system 100 and a chassis 180 may have different numbers and arrangements of the illustrated components and may also include other parts that are not illustrated.

The modular rear panel system 100 shown in FIG. 1 can be used to form a rear panel of the chassis of an electronic system, such as the example rear panel 185 of the chassis 180 shown in FIG. 2. More specifically, a plurality of differently configured rear panels can be formed from the modular rear panel system 100. These different configurations of rear panels can be used with different configurations of electronic components of the electronic system.

As shown in FIG. 1, the modular rear panel system 100 comprises a plurality of bracket mounting locations 110 (also referred to as "mounting locations 110"), a plurality of modular brackets 120 (also referred to as "brackets 110"), and a plurality of modular rear panel sections 150 (also referred to as "rear panel sections 150" or "sections 150"). The modular brackets 120 include a plurality of types of modular bracket 120 that are mutually different from one another (in other words, the plurality of modular brackets 120 is not merely a group of identical brackets, but instead comprises multiple different brackets). In some examples, all of the modular brackets 120 are mutually different from one another. In other examples, only some of the modular brackets 120 are mutually different from one another and some identical modular brackets 120 may be included. Similarly, the modular rear panel sections 150 include a plurality of types of modular rear panel section 150 that are mutually different from one another, and in some examples all of the modular rear panel section 150 are mutually different from one another while in other examples, only some of the modular rear panel section 150 are mutually different from one another and some identical modular rear panel section 150 may be included. In the figures and in the description below, an index is used to refer to specific types of brackets 120 and rear panel sections 150, such as a bracket 120_1 or a rear panel section 150_2, and different indexes refer to mutually different types of such brackets 120 and rear panel sections 150. For example, FIG. 1 illustrates "N" mounting locations 110_1 to 110_N, "M" mutually different types of brackets 120_1 to 120_M, and "P" mutually different types of sections 150_1 to 150_P, wherein N, M, and P can each be any integer greater than 2. M, N, and P can be different from one another; in particular, in some examples, M is greater than N so that, for at least some of the mounting locations, multiple different brackets 120 can be installed at the mounting location 110.

The bracket mounting locations 110 correspond to locations at which brackets 120 can be mounted to a wall of a chassis (e.g., to the base and/or lateral walls of the chassis) or to some other support structure (e.g., to a supporting rear panel section 186 described below) that is in turn coupled to a wall of the chassis. Each type of bracket 120 corresponds to one of the mounting locations 110 and is configured to be selectively attached to the corresponding mounting location 110 (in some cases, multiple types of brackets 120 may correspond to the same mounting location 110). Moreover, each type of bracket 120 corresponds to one or more of the rear panel sections 150 and is configured to have the corresponding rear panel section 150 attached thereto. Thus, a rear panel having a desired arrangement of the rear panel sections 150 (such as the rear panel 185 illustrated in FIG. 2) can be formed using the modular rear panel system 100 by selecting, from among the plurality of rear panel sections 150, a subset of the rear panel sections 150 that corresponds to a desired configuration of electronic components, then selecting, from among the plurality of bracket 120, a subset of the brackets 120 that correspond to the selected subset of rear panel sections 150, then attaching the selected brackets 120 to the corresponding mounting locations 110, and finally attaching the selected rear panel sections 150 to the selected brackets 120 (the order in which sections 150 are coupled to brackets 120 and brackets are coupled to mounting locations 110 may be reversed, in some cases). In other words, the modular brackets 120 and the modular rear panel sections 150 comprise (i.e., can be grouped into) a plurality of different combinations, each comprising a subset of the modular rear panel sections 150 and subset of the modular brackets 120, and each of these combinations can be assembled together to form a rear panel having a different configuration than the rear panels assembled from others of the combinations. These combinations comprise mutually different subsets of brackets 120 and mutually different subsets of sections 150 (mutually different here means that the subsets all differ from one another in at least one member, but does not mean that there cannot be some overlapping membership between the subsets—for example, the sets [a, b, c], [a, b], [a, c], [d, e], [a, a, b, c], and [a, b, c, d] are all mutually different).

As shown in FIG. 1, each bracket 120 comprises bracket attachment features 121 that are configured to engage (directly or indirectly) with the bracket attachment features 111 of the corresponding mounting location 110 to attach the bracket 120 to the mounting location 110. The engagement between bracket attachment features 111 and 121 is indicated by an arrow in FIG. 1. For example, the bracket attachment features 111 and 121 may each comprise holes that are arranged so as to be aligned with one another and both receive the same fastener (e.g., screw) so as to attach the bracket 120 to the mounting location 110. As another example, one of the bracket attachment features 111 and 121 may comprise a hole while the other comprises a fastener (e.g., screw) to be inserted int eh hole. As another example, the bracket attachment features 111 and 121 may comprise complementary engaging features that latch together, such as a protrusion and a recess configured to receive the protrusion. In some examples, each of the mounting location 110 corresponds to, and is configured to interchangeably receive, two or more different types of the brackets 120.

In some examples, one or more of the mounting locations 110 may be part of a chassis wall to which the rear panel will ultimately be connected once the rear panel has been formed. For example, one or more of the mounting locations 110 may be part of the base or lateral walls of the chassis. In some examples, the modular rear panel system 100 further comprises one or more supporting rear panel sections 186, which are rear panel sections that are attached directly to walls of the chassis (e.g., a base and/or lateral walls) rather than being attached to the chassis via one of the brackets 120. These are referred to herein as "supporting" rear panel sections 186 because they provide support for one or more of the brackets 120, which are coupled thereto. In some examples, the supporting rear panel sections 186 may be common to each configuration of the rear panel that can be formed from the modular rear panel system 100—that is, while different configurations of the rear panel may comprise different combinations of modular rear panel sections 150, they all may have the same supporting rear panel sections 186 in some examples. The supporting rear panel sections 186 may comprise, for example, an input/output section that is coupled to the base of the chassis and has apertures for connectors of a primary circuit board and perforations for airflow. The supporting rear panel sections 186 may also comprise, for example, a divider wall coupled to the base and/or lateral walls of the chassis to define a compartment within the chassis (e.g., a compartment for holding a power supply unit). Thus, in some examples brackets 120 may be directly coupled to the chassis walls, in other examples brackets 120 may be indirectly coupled to the chassis walls via the support rear panel sections 186, and in still other examples some brackets 120 are directly coupled to the chassis walls while other brackets 120 are indirectly coupled to the chassis walls via the supporting rear panel sections 186.

As noted above, the modular rear panel sections 150 are configured to be attached to corresponding modular brackets 120. Specifically, each modular rear panel section 150 includes panel attachment features 152 and the corresponding modular brackets 120 comprise panel attachment features 122 that engage with the panel attachment features 152 to attach the modular rear panel section 150 to the corresponding modular brackets 120. The engagement between panel attachment features 122 and 152 is indicated by an arrow in FIG. 1. For example, the panel attachment features 122 and 152 may each comprise holes that are arranged so as to be aligned with one another and both receive the same fastener (e.g., screw) so as to attach the rear panel section 150 to the bracket 120. As another example, the panel attachment features 122 and 152 may comprise complementary engaging features that latch together, such as a protrusion and a groove/recess configured to receive the protrusion. In some cases, a single modular rear panel sections 150 may be coupled to multiple brackets 120 at once, such as one bracket 120 positioned on one side of the rear panel section 150 and another bracket 120 positioned on the opposite side of the rear panel section 150, and thus the rear panel section 150 may comprise multiple sets of panel attachment features 152. In some examples, a given bracket 120 may correspond to multiple panel sections 150. That is, it may be possible for multiple different types of panel sections 150 to be coupled to the same bracket 120 (although only one at a time).

As noted above, the plurality of panel sections 150 includes at least some mutually different types of panel sections 150. In some cases, some duplicates of the same type of panel section 150 may be included in a given combination of panel sections 150 and brackets 120 used to form a rear panel, but at least two of the panel sections 150 in each combination may be mutually different. In some examples, the different types of rear panel sections 150 have differing widths (e.g., some extend along a width dimension of the chassis across a full width of the chassis, while others may extend less than the full width of the chassis) and/or different heights (e.g., some may extend along a height dimension of the chassis a first distance, while other extend a second distance which is less than the first distance). Moreover, in some examples, the different types of rear panel sections 150 have different functions, such as housing different types of electronic components. For example, some rear panel sections 150 may be configured to house removable devices, while others may be configured to house expansion cards. As another example, some rear panel sections 150 may be configured to house a certain type of removable device (e.g., LFF storage drive) while others may be configured to house another type of removable device (e.g., SFF storage drive).

For example, the rear panel sections 150 may include a plurality of different types of removable device cages, which comprising bays for holding different types and/or numbers of removable devices. Removable devices may include, for example, storage drives, line cards, optical transceivers, or the like. In some examples, the removable device cages comprise drive cages for removably holding storage drives (e.g., hard disk drives (HDDs) or solid state drives (SSDs)). Of course, all devices are removable in the trivial sense that it is physically possible to remove them, but as used herein "removable" is used more specifically to mean that the devices can be removed without requiring destruction of parts (e.g., cutting, breaking, melting solder, etc.) and without requiring the chassis to be opened to facilitate removal. In some examples, removable devices are also hot-swappable, meaning they can be removed while the system is powered on without requiring a shutdown. In some cases, removable devices may also be configured for toolless removal, for example by including latches or other attachment features that are designed for actuation without tools. The removable device cages may differ from one another in their overall size, the number of bays they contain, and/or the type of removable components held thereby. For example, one rear panel section 150 may comprise a drive cage with four bays for Large Form Factor (LFF) drives, another rear panel section 150 may comprise cage with eight bays for Small Form Factor (SFF) drives, and so on for a variety of different types of removable media and/or different numbers of bays.

As another example, the rear panel sections 150 may include expansion slot units configured to hold expansion cards (e.g., PCIe expansion cards). These expansion slot unit rear panel sections 150 may also come in a variety of sizes, such as a one-slot unit, a two-slot unit, a three-slot unit, and so on.

As another example, the rear panel sections 150 may include power supply units (e.g., a redundant or extra power supply unit in addition to the one already included in each electronic system).

Thus, the modular rear panel system 100 may be compatible with many differently configured electrical systems having different combinations of electronic components. For example, if an electronic system is to be produced which has a certain configuration of electronic components, then a rear panel that is compatible with that configuration may be formed by selecting the appropriate rear panel sections 150 corresponding to those electrical components (i.e., selecting a subset of the rear panel sections 150) and selecting corresponding brackets 120 to which those rear panel sections 150 may be attached (i.e., selecting a subset of bracket 120 corresponding to the subset of sections 150). In other words, the plurality of brackets 120 and the plurality of rear panel sections 150 may be combined in a variety of different ways to form rear panels having different combinations of rear panel sections 150.

In some examples, the modular brackets 120 and/or rear panel sections 150 are removable, meaning they can be removed from the chassis without destruction of parts. This may enable changes in configuration of the rear panel subsequent to manufacture by replacing one or more rear panel sections 150 and/or brackets 120 with another one of the rear panel sections 150 and/or brackets 120.

FIG. 2 illustrates one example chassis 180 for an electronic system. The chassis 180 comprises chassis walls 181 including a base 182 serving as a bottom of the chassis 180, two lateral walls 183 that are coupled to the base 182, and a top cover 184 coupled to the lateral walls 183. In some examples, the chassis 180 may also comprise a front section (not illustrated).

The chassis 180 also comprises a rear panel 185, which is formed from the modular rear panel system 100 of FIG. 1. The rear panel 185 comprises a selection of modular rear panel sections 150 (which is a subset of the plurality of sections 150) and a selection of modular brackets 120 (which is a subset of the plurality of brackets 120), with each of the brackets 120 being coupled to a corresponding mounting location 110. In the example chassis 180 of FIG. 2, two modular rear panel sections 150 are selected out of the P sections 150, i.e., a first section 150_1 and second section 150_2. These sections 150_1 and 150_2 may correspond to different electronic components of an electrical system of which the chassis 180 is a part, and hence these sections 150 were selected to provide the rear panel 185 with a configuration that is compatible with those electronic components. Two modular rear panel sections 150 are illustrated in this example merely for convenience, and other examples of the chassis 180 may have any number of modular rear panel sections 150.

In the example chassis 180 of FIG. 2, there are three mounting locations, i.e., first, second, and third mounting locations 110_1 to 110_3. Accordingly, in this example three brackets 120 have been selected out of the M brackets 120 of the modular rear panel system 100 of FIG. 1 (one for each mounting location 110), i.e., a first bracket 120_1 attached to the first mounting location 110_1, a second bracket 120_2 attached to the second mounting location 110_1, and a third bracket 120_3 attached to the third mounting location 110_3. These brackets 110_1 to 110_3 were selected for inclusion in the rear panel 185 because they correspond to the selected first and second sections 150_1 and 150_2—i.e., the first bracket 120_1 corresponds to the first section 150_1, the second bracket 120_2 corresponds to both the first section 150_1 and the second section 150_2, and the third bracket 120_3 corresponds to the second section 150_2. Thus, the first section 150_1 is attached to the first bracket 120_1 and to the second bracket 120_2 (e.g., one at each side of the first section 150_1), and the second section 150_2 is attached to the second bracket 120_2 and to the third bracket 120_3 (e.g., one at each side of the second section 150_2). Other brackets 120 out of the set of M brackets 120 are also attachable to the first, second, and third mounting location 110_1 to 110_3, but these brackets 120 were not selected for inclusion in this particular rear panel 185 because those brackets 120 do not correspond to the selected rear panel sections 150_1 and 150_2. FIG. 2 shows one example with three brackets 120, and in other examples of the chassis 180 different numbers and arrangements of brackets 120 are included.

In the example illustrated in FIG. 2, the rear panel 185 further comprises a supporting rear panel section 186 as was described above. Moreover, in this example the first and second mounting locations 110_2 are part of the supporting rear panel section 186, as indicated by dashed arrows. Thus, the first bracket and second bracket 120_1 and 120_2 are coupled to the supporting rear panel section 186 at the first and second mounting locations 110_1 and 110_2. The supporting rear panel section 186 is coupled to one or more chassis walls 181, such as the base 182 for example. Thus, the first bracket and second bracket 120_1 and 120_2 are indirectly coupled to the chassis walls 181 via the supporting rear panel section 186. In contrast, the third mounting location 110_3 is part of one of the chassis walls 181 (e.g., one of the lateral walls 183), and thus the third bracket 120_3 is coupled directly to the chassis walls 181. In other examples, all of the brackets 120 may be coupled to supporting rear panel section(s) 186 (i.e., all of the mounting locations 110 may be part of a supporting rear panel section 186). In still other examples, the supporting rear panel section 186 may be omitted and all of the brackets 120 may be coupled directly to the chassis walls 181 (i.e., each of the mounting locations may be part of one of the chassis walls 181).

Turning now to FIGS. 3-23, an example configuration of a modular rear panel system 200 will be described. The modular rear panel system 200 is a specific configuration of the modular rear panel system 100 described above. Similar components of the modular rear panel systems 100 and 200 will be given similar reference numbers having the same last two digits, such as 120 and 220. The descriptions of components of the modular rear panel system 100 are applicable to the similar component of the modular rear panel system 200, and thus duplicative description of such components is omitted below.

Figure 3:
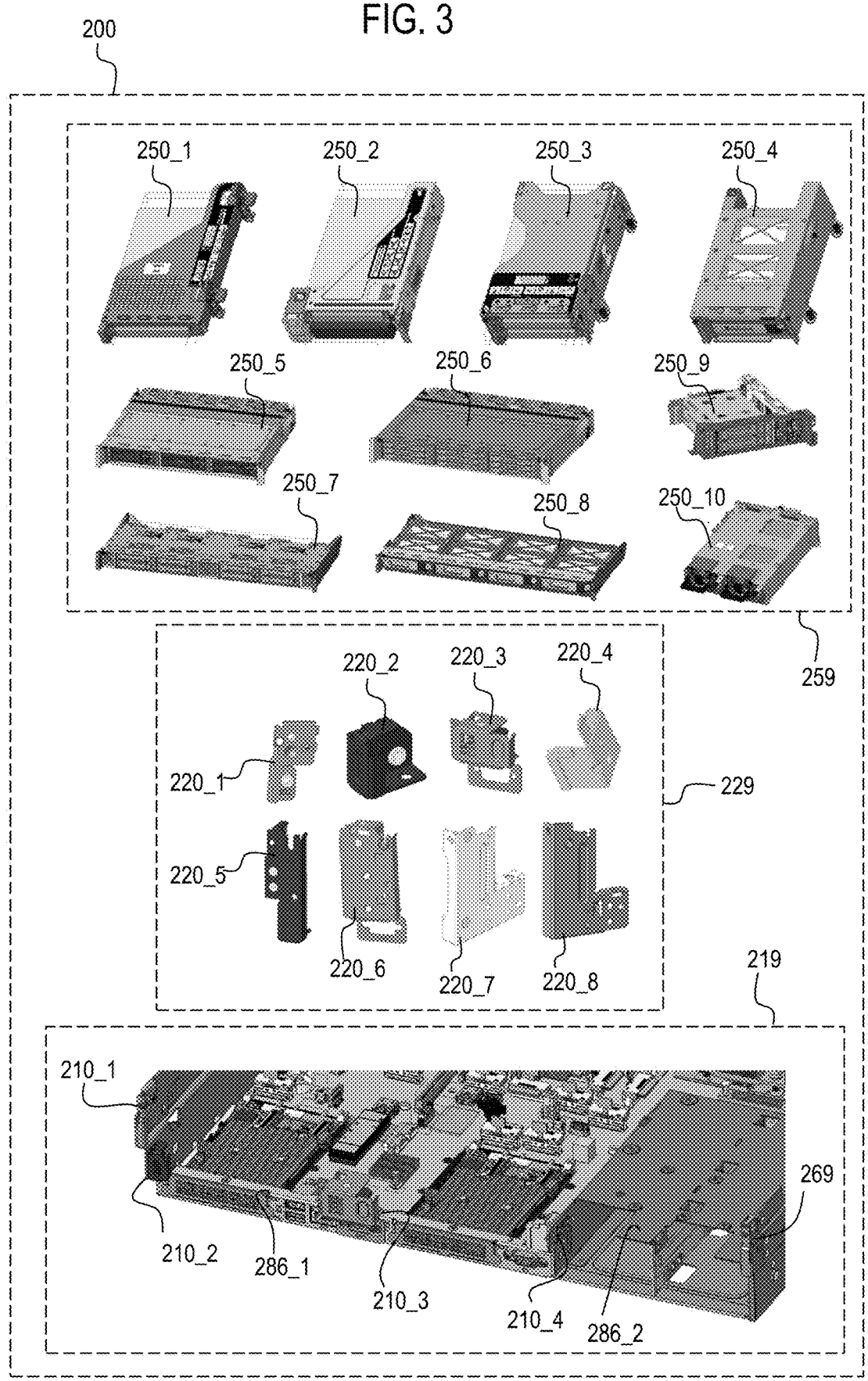
FIG. 3 is schematic diagram illustrating another example modular rear panel system for forming a rear panel of a chassis of an electronic device.

FIG. 3 comprises an overview of the modular rear panel system 200. Each of the individual components illustrated in FIG. 3 is shown in greater detail in subsequent figures. As shown in FIG. 3, the modular rear panel system 200 comprises a plurality 259 of modular rear panel sections 250 (i.e., sections 250_1 to 250_10), a plurality 229 of modular brackets 220 (i.e., brackets 220_1 to 220_8), and a plurality 219 of mounting locations 210 (i.e., mounting locations 210_1 to 210_4). The mounting locations 210 are illustrated in FIG. 3 with a selection of the brackets 220 mounted thereto for illustration purposes, but other brackets 220 could be mounted to these locations instead of the illustrated brackets 220, as will be described further below.

Figure 4A:
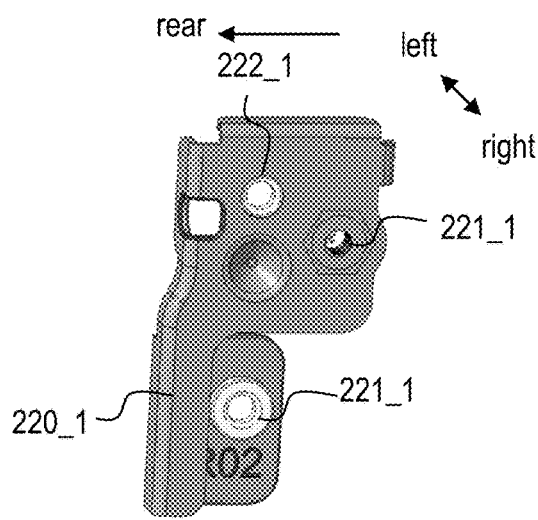
FIG. 4A is a perspective view of a modular bracket of the example modular rear panel system of FIG. 3.
Figure 4B:
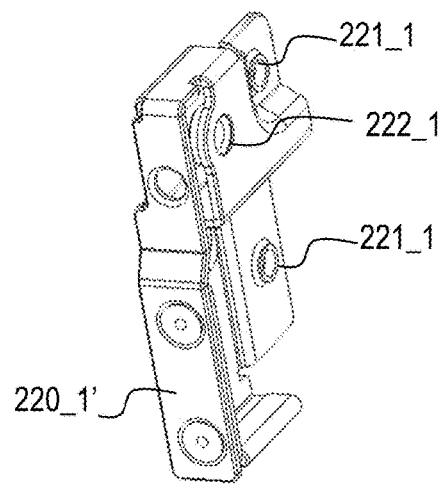
FIG. 4B is a perspective view of another modular bracket, which is a variation of the bracket of FIG. 4A.
Figure 22:
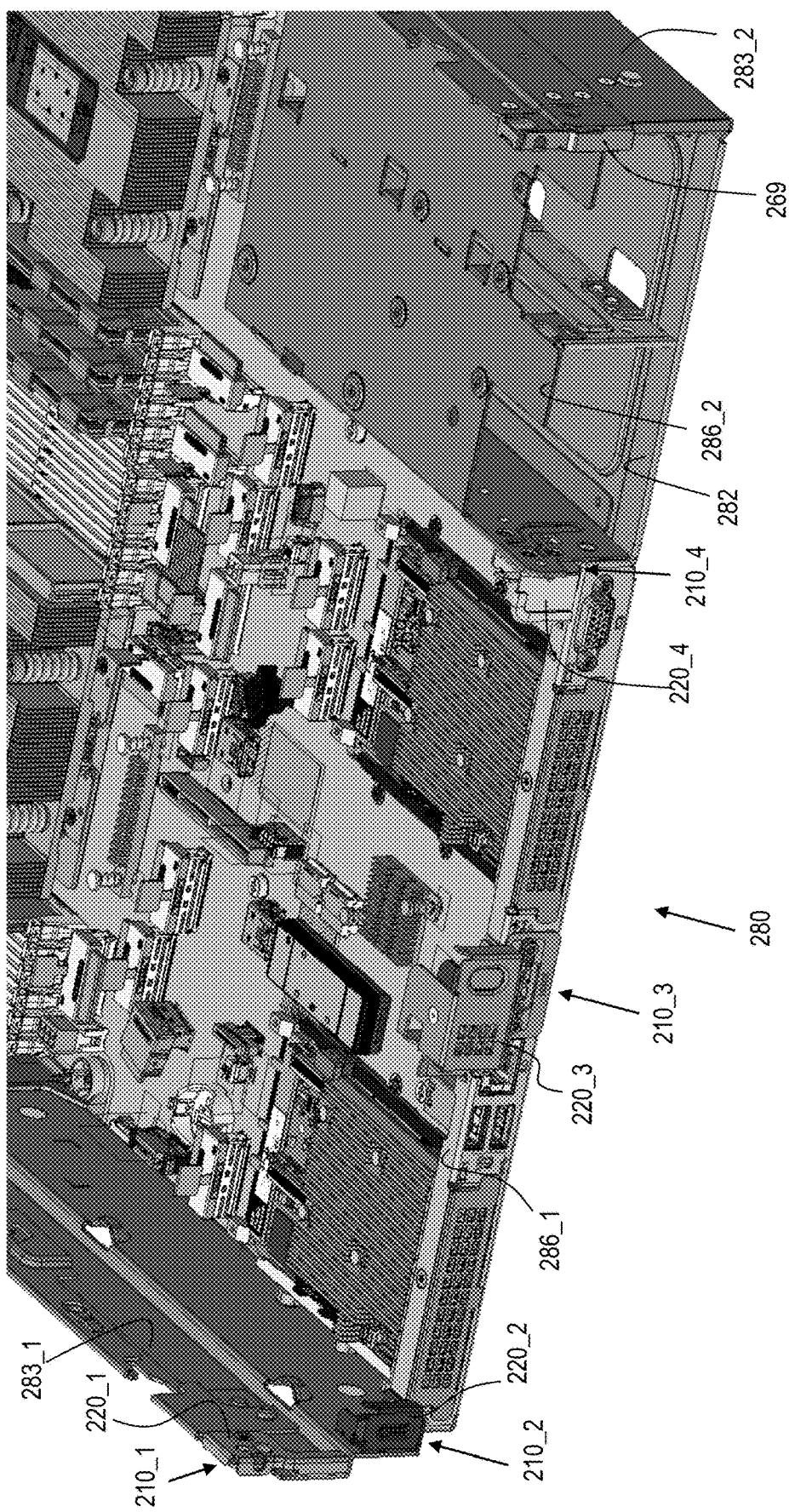
FIG. 22 is a perspective view of a portion of an example chassis showing a first subset of the modular brackets of the example modular rear panel system of FIG. 3 attached to example mounting locations.

FIG. 4A illustrates a first bracket 220_1. FIG. 4B illustrates another first bracket 220_1', which is a variation of the first bracket 220_1. The description below will refer primarily to the first bracket 220_1 and FIG. 4A for ease of description, but the descriptions also apply to the first bracket 220_1' and FIG. 4B. The first bracket 220_1 comprises bracket attachment features 221_1 configured to engage with bracket attachment features (not illustrated) of the first mounting location 210_1 to attach the bracket 220_1 to the first mounting location 210_1, which is part of the lateral wall 283_1 of a chassis 280 as shown in FIG. 22. The first mounting location is on a left side of the rear panel 285 from the perspective of FIGS. 3 and 23. Furthermore, the first mounting location is located near a top portion of the rear panel 285, and the sections attached to the first bracket 220_1 generally occupy the top half of the vertical dimension of the rear panel, while, occupying varying amounts of the horizontal dimensions, as shown in FIGS. 24-28. Returning to FIG. 4A, in this example the bracket attachment features 221_1 comprise one or more holes configured to align with holes in the first mounting location 210_1 and receive screws, bolts, or other mechanical fasteners therethrough. Furthermore, the first bracket 220_1 corresponds to each of the modular rear panel sections 250_5, 250_6, 250_7, and 250_8 (i.e., various types of drive cages), and is thus configured to have any one of these sections attached thereto, as shown in FIGS. 24-28. As shown in FIG. 4A, the bracket 220_1 comprises a panel attachment feature 222_1 configured to engage with complementary panel attachment features 252a_5, 250a_6, 250a_7, and 250a_8 on a left side of the rear panel sections 250_5, 250_6, 250_7, and 250_8 when the section is positioned to the right of the bracket 220_1 (from the perspective shown in FIGS. 3 and 23). In this example, the panel attachment features 222_1 and comprise a hole configured to receive a complementary panel attachment features 252a_5, 250a_6, 250a_7, and 250a_8 in the form of a screw (e.g., thumbscrew), pin (e.g., spring loaded pin), or stud extending laterally from one side of the rear panel sections 250_5, 250_6, 250_7, and 250_8.

Figure 5A:
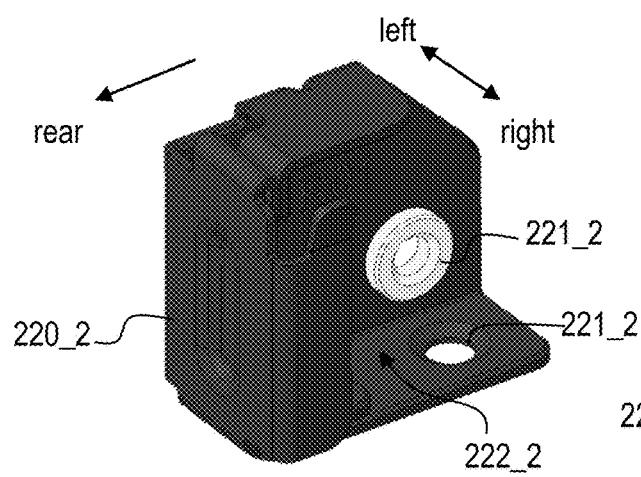
FIG. 5A is a perspective view of another modular bracket of the example modular rear panel system of FIG. 3.
Figure 5B:
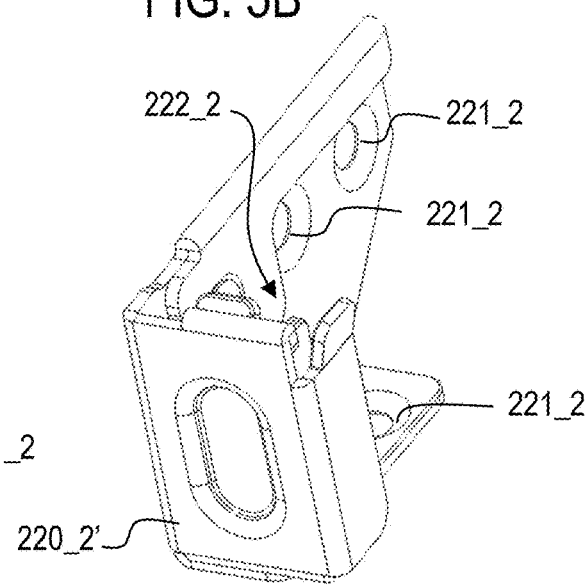
FIG. 5B is a perspective view of another modular bracket, which is a variation of the bracket of FIG. 5A.

FIG. 5A illustrates a second bracket 220_2. FIG. 5B illustrates another second bracket 220_2', which is a variation of the second bracket 220_2. The description below will refer primarily to the second bracket 220_2 and FIG. 5A for ease of description, but the descriptions also apply to the second bracket 220_2' and FIG. 5B. The second bracket 220_2 comprises bracket attachment features 221_2 configured to engage with bracket attachment features (not illustrated) of the second mounting location 210_2 to attach the bracket 220_2 to the second mounting location 210_2, as shown in FIG. 22. The second mounting location 210_2 is located where the lateral wall 283_1 of a chassis 280 meets a first supporting rear panel section 286_1 along a left side of the rear panel 285, and the second mounting location 210_2 may thus be part of the lateral wall 283_1 and/or part of the first supporting rear panel section 286_1. Accordingly, the second bracket 220_2 may be attached to the lateral wall 283_1, the first supporting rear panel section 286_1, or both. The second mounting location 210_2 is lower along a vertical dimension than the first mounting location 210_1. As shown in FIG. 5A, the bracket attachment features 221_2 comprise holes configured to align with holes in the second mounting location 210_2 and receive screws, bolts, or other mechanical fasteners therethrough. Furthermore, the second bracket 220_2 corresponds to the modular rear panel section 250_1 (single-slot expansion slot), and is configured to have the section 250_1 attached thereto as shown in FIGS. 24-28. Returning to FIG. 5A, the bracket 220_2 comprises a panel attachment feature 222_2 configured to engage with complementary panel attachment feature 252a_1 on a left side of the rear panel section 250_1 when the section is positioned to the right of the bracket 220_2. In this example, the panel attachment feature 222_2 comprise a receptacle and the complementary panel attachment feature 252a_1 of the rear panel section 250_1 comprise a horizontally protruding tab configured to be received within the receptacle (See FIGS. 12 and 25).

Figure 6A:
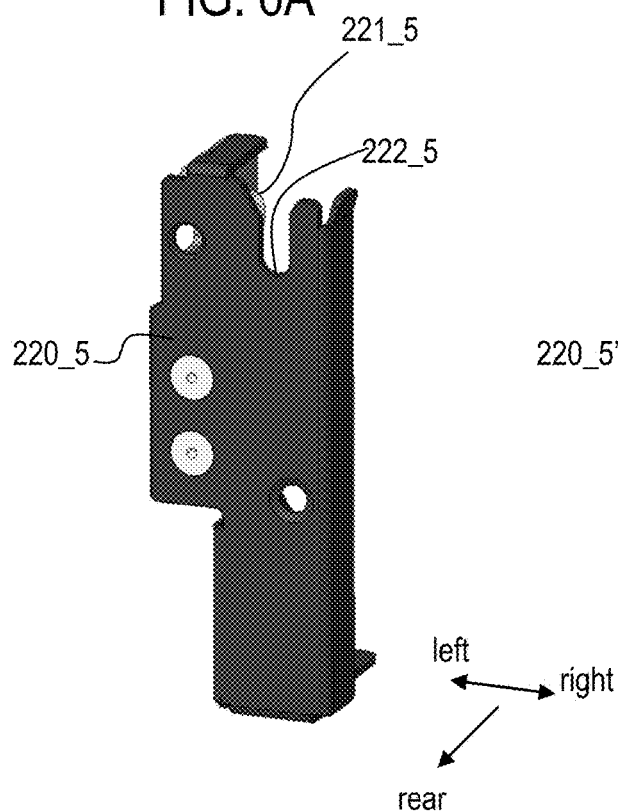
FIG. 6A is a perspective view of another modular bracket of the example modular rear panel system of FIG. 3.
Figure 6B:
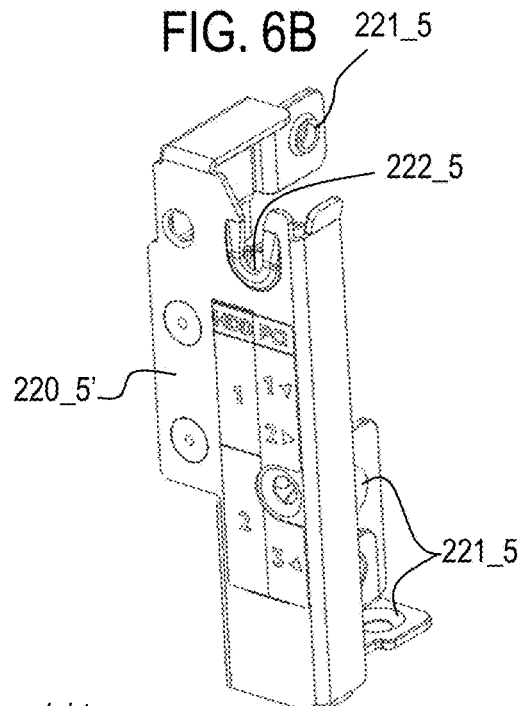
FIG. 6B is a perspective view of another modular bracket, which is a variation of the bracket of FIG. 6A.
Figure 23:
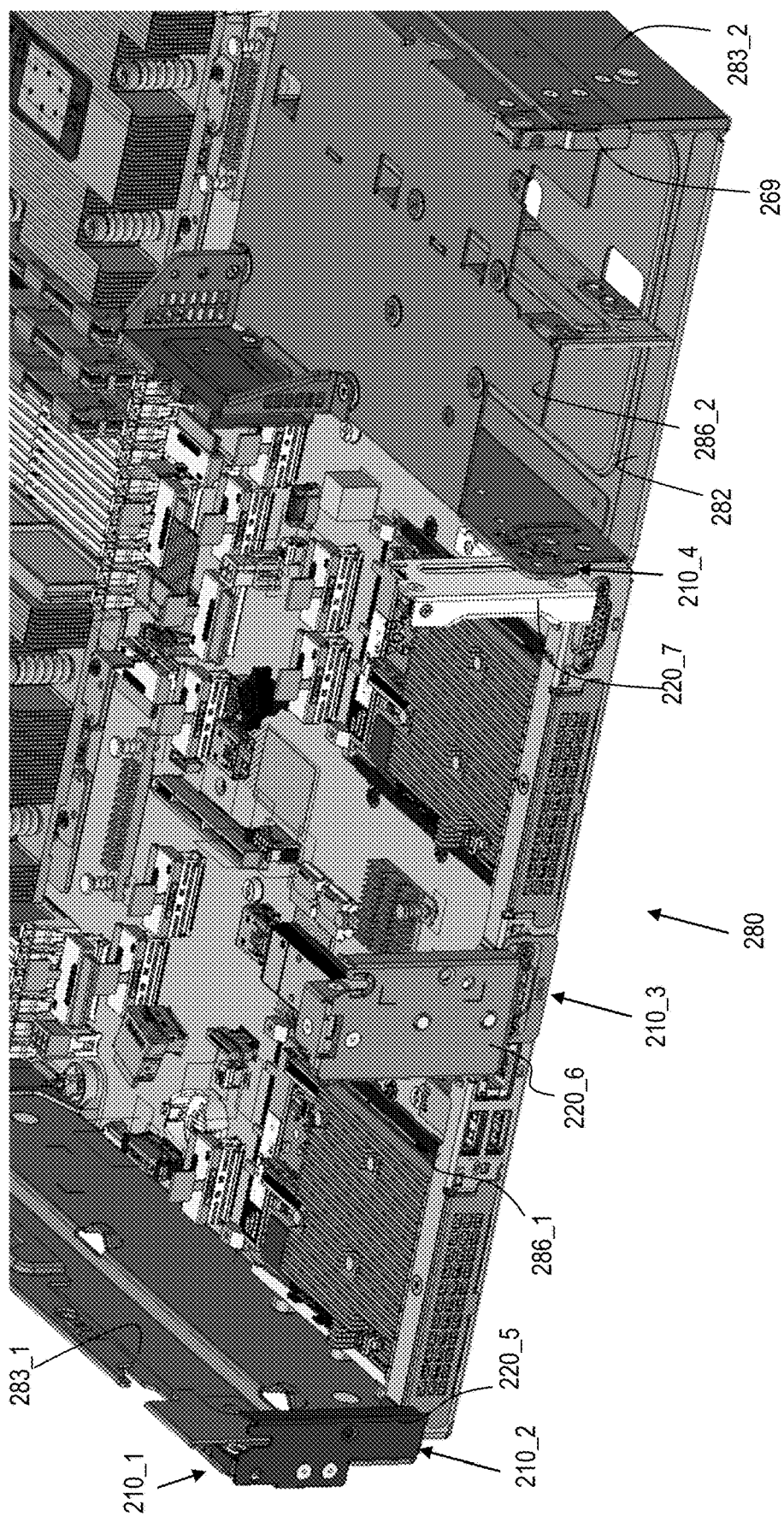
FIG. 23 is a perspective view of the portion of the chassis showing a second subset of the modular brackets of the example modular rear panel system of FIG. 3 attached to the mounting locations.

FIG. 6A illustrates a fifth bracket 220_5. FIG. 6B illustrates another fifth bracket 220_5', which is a variation of the fifth bracket 220_5. The description below will refer primarily to the fifth bracket 220_5 and FIG. 6A for ease of description, but the descriptions also apply to the fifth bracket 220_5' and FIG. 6B. The fifth bracket 220_5 comprises bracket attachment features 221_5 configured to engage with bracket attachment features (not illustrated) of the first and/or second mounting location 210_1 and 210_2 to attach the bracket 220_5 to the first and/or second mounting locations 210_1 and 210_2, as shown in FIG. 23. Thus, the fifth bracket 220_5 may be used in lieu of the first and second brackets 220_1 and 210_2, or vice versa. Only one bracket attachment feature 221_5 is visible in FIG. 6A, but additional bracket attachment features 221 may be included, such as ones similar to those of the first and second brackets 220_1 and 210_2, as shown in FIG. 6B. The bracket attachment features 221_5 comprise holes configured to align with holes in the first and/or second mounting location 210_1 and 210_2 and receive screws, bolts, or other mechanical fasteners therethrough. Accordingly, the fifth bracket 220_5 may be attached to the lateral wall 283_1, the first supporting rear panel section 286_1, or both. Furthermore, the fifth bracket 220_5 corresponds to the modular rear panel section 250_3 (3-slot expansion slot) and modular rear panel section 250_4 (drive cage for two bay LFF drives), and is configured to have either one of these attached thereto, as shown in FIGS. 28-32. The bracket 220_5 comprises a panel attachment feature 222_5 configured to engage with complementary panel attachment features 252a_3 or 252a_4 on a left side of the sections 250_3 or 252_4 when the section is positioned to the right of the bracket 220_5. In this example, the panel attachment feature 222_5 comprise a slot in a rear vertical face of the bracket 220_5 and the complementary panel attachment features 252a_3 and 252a_4 comprise pins or studs that protrude horizontally rearward and are configured to be received in slot (see FIGS. 14, 15, 29, and 30).

Figure 7A:
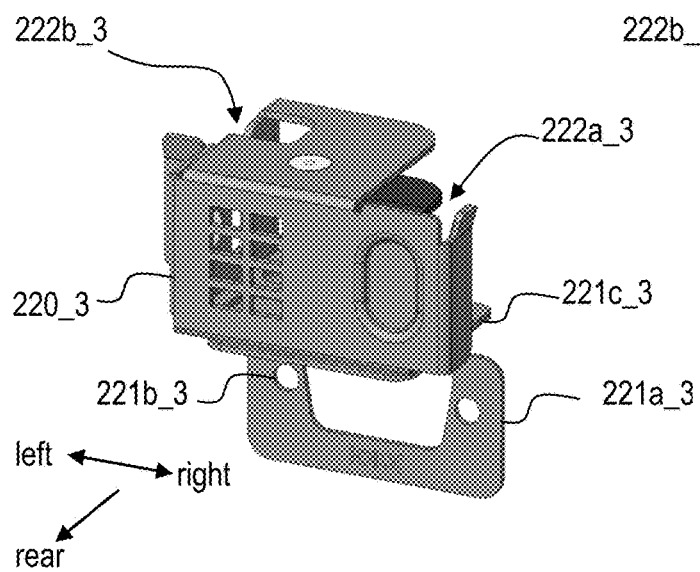
FIG. 7A is a perspective view of another modular bracket of the example modular rear panel system of FIG. 3.
Figure 7B:
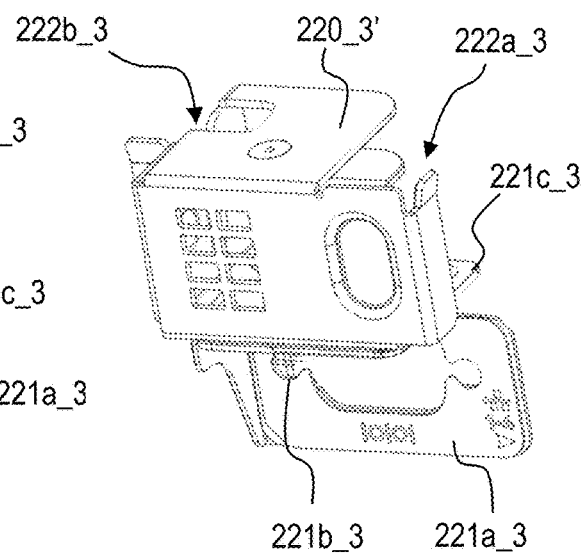
FIG. 7B is a perspective view of another modular bracket, which is a variation of the bracket of FIG. 7A.

FIG. 7A illustrates a third bracket 220_3. FIG. 7B illustrates another third bracket 220_3', which is a variation of the third bracket 220_3. The description below will refer primarily to the third bracket 220_3 and FIG. 7A for ease of description, but the descriptions also apply to the third bracket 220_3' and FIG. 7B. The third bracket 220_3 comprises bracket attachment features 221_3 configured to engage with bracket attachment features (not illustrated) of the third mounting location 210_3 to attach the bracket 220_3 to the third mounting location 210_3, as shown in FIG. 22. The third mounting location 210_3 is located on the first supporting rear panel section 286_1, and accordingly, the third bracket 220_3 is attached to the supporting rear panel section 286_1. The third mounting location 210_3 is located about a third of the way across a lateral width of the chassis 280 from the first and second mounting locations 210_1 and 210_2. As shown in FIG. 7A, the bracket attachment features 221_3 comprise vertical flange 221a_3, holes 221b_3 in the vertical flange 221a_3, and a horizontal flange 221c_3. The vertical flange 221a_3 is configured to abut a rear vertical face of the supporting rear panel section 286_1, while the horizontal flange 221c_3 is configured to abut a top horizontal face of the supporting rear panel section 286_1, as shown in FIG. 22. The holes 221b_3 are configured to align with holes in the vertical face of the supporting rear panel section 286_1 and receive screws, bolts, or other mechanical fasteners therethrough. The bracket attachment features 221_3 may also include, in some examples, additional holes (not illustrated) in the horizontal flange 221c_3 that align with holes in the top horizontal face of the supporting rear panel section 286_1 to receive fasteners therethrough. Furthermore, the third bracket 220_3 corresponds to the modular rear panel section 250_1 (single-slot expansion slot), and is configured to have one such section 250_1 attached to each lateral side of the bracket 220_3 as shown in FIGS. 24-28. Returning to FIG. 7A, the bracket 220_3 comprises a first panel attachment feature 222a_3 on a right side thereof configured to engage with a complementary panel attachment features 252a_1 on a left side of one rear panel section 250_1 when the section 250_1 is positioned to the right of the bracket 220_3, and a second panel attachment feature 222b_3 on the left side of the bracket 220_3 configured to engage with a complementary panel attachment features 252b_1 on a right side of another rear panel section 250_1 when the section is positioned to the left of the bracket 220_3. The first panel attachment feature 222a_3 comprise a receptacle similar to the panel attachment features 222_2. The panel attachment feature 222b_3 comprises a slot in a lateral vertical face of the bracket 220_3 and the complementary panel attachment feature 252b_1 comprises a horizontally protruding flange configured to be received in the slot (see FIGS. 12 and 25). The vertical flange 221a_3 may also comprise an aperture configured to receive an electrical connector of the electronic system.

Figure 8A:
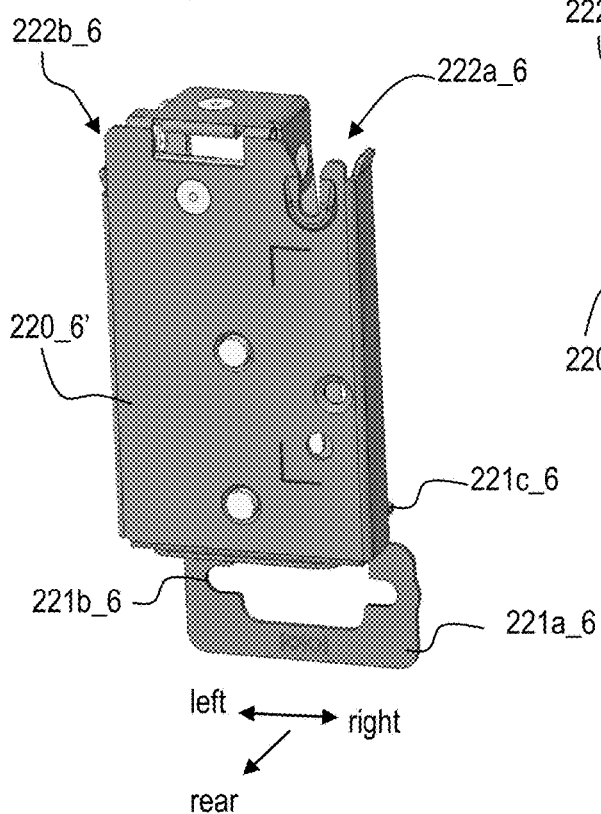
FIG. 8A is a perspective view of another modular bracket of the example modular rear panel system of FIG. 3.
Figure 8B:
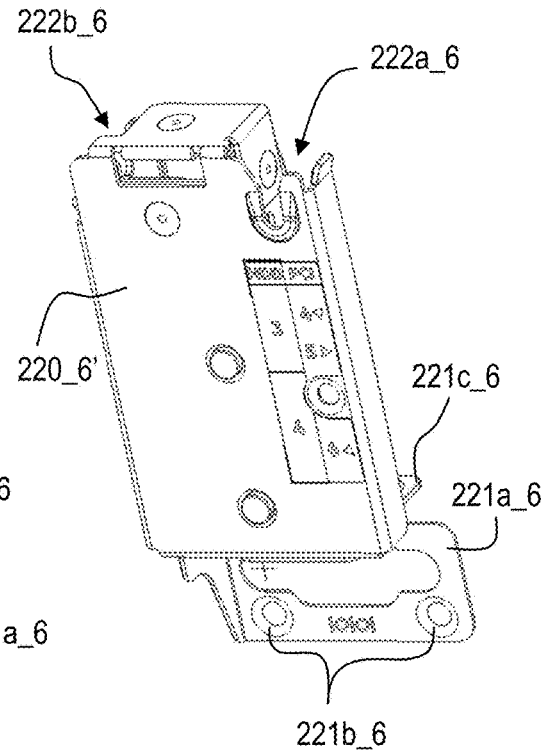
FIG. 8B is a perspective view of another modular bracket, which is a variation of the bracket of FIG. 8A.

FIG. 8A illustrates a sixth bracket 220_6. FIG. 8B illustrates another sixth bracket 220_6', which is a variation of the sixth bracket 220_6. The description below will refer primarily to the sixth bracket 220_6 and FIG. 8A for ease of description, but the descriptions also apply to the sixth bracket 220_6' and FIG. 8B. The sixth bracket 220_6 comprises bracket attachment features 221_6 configured to engage with bracket attachment features (not illustrated) of the third mounting location 210_3 to attach the bracket 220_3 to the third mounting location 210_3, as shown in FIG. 23. The sixth bracket 220_6 may thus be used in lieu of the third bracket 220_3, or vice versa. As shown in FIG. 8A, the bracket attachment features 221_6 comprise vertical flange 221a_6, holes 221b_6 in the vertical flange 221a_6, and a horizontal flange 221c_6, which are similar to the bracket attachment features 221_3 described above. Furthermore, the sixth bracket 220_6 corresponds to the modular rear panel sections 250_3 and 250_4, and is configured to receive one of these on each lateral side of the bracket 220_6 as shown in FIGS. 24-28 (e.g., the bracket 220_6 receives two sections 250_3, two sections 250_4, or one section 250_3 and one section 250_4). Returning to FIG. 8A, the bracket 220_6 comprises a first panel attachment feature 222a_6 on a right side thereof configured to engage with a complementary panel attachment features 252a_3 or 252a_4 on a left side of one rear panel section 250_3 or 250_4 when the section is positioned to the right of the bracket 220_6, and a second panel attachment feature 222b_6 on the left side of the bracket 220_6 configured to engage with a complementary panel attachment feature 252b_3 or 252b_4 on the right side of another rear panel section 250_3 or 250_4 when the section is positioned to the left of the bracket 220_6. The first panel attachment feature 222a_6 comprise a slot in a rear vertical face of the bracket 220_6, which is configured to receive a pin or stud protruding horizontally rearward, similar to the panel attachment features 222_5. The panel attachment feature 222b_6 comprises another slot, this one in a lateral vertical face of the bracket 220_6, and the complementary panel attachment feature 252b_1 comprises another pin or stud, this one protruding laterally and configured to be received in the slot (see FIGS. 14, 15, 29, and 30). The vertical flange 221a_6 may also comprise an aperture configured to receive an electrical connector of the electronic system.

Figure 9:
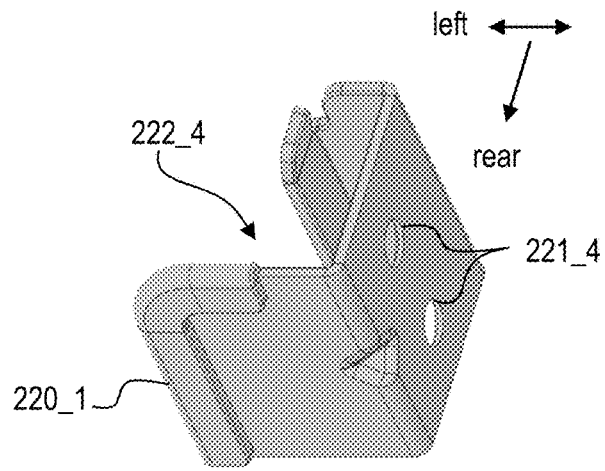
FIG. 9 is a perspective view of another modular bracket of the example modular rear panel system of FIG. 3.

FIG. 9 illustrates a fourth bracket 220_4. The fourth bracket 220_4 comprises bracket attachment features 221_4 configured to engage with bracket attachment features (not illustrated) of the fourth mounting location 210_4 to attach the bracket 220_4 to the fourth mounting location 210_4, as shown in FIG. 22. The fourth mounting location 210_4 is located at lateral wall of a second supporting rear panel section 286_2. Accordingly, the fourth bracket 220_4 may be attached to the second supporting rear panel section 286_2. The fourth mounting location 210_4 may be located approximately two thirds of the way across the lateral width of the chassis 280 from the first and second mounting locations 210_1 and 210_2. As shown in FIG. 9, the bracket attachment features 221_4 comprise holes configured to align with holes in the fourth mounting location 210_4 and receive screws, bolts, or other mechanical fasteners therethrough. Furthermore, the fourth bracket 220_4 corresponds to (i.e., is configured to receive) the modular rear panel section 250_1 (single-slot expansion slot), as shown in FIGS. 24-28. Returning to FIG. 9, the bracket 220_4 comprises a panel attachment feature 222_4 configured to engage with complementary panel attachment feature 252b_1 of the rear panel section 250_1. In this example, the panel attachment feature 222_4 comprise a receptacle and the complementary panel attachment feature 252a_1 of the rear panel section 250_1 comprise a flange (See FIGS. 12 and 25).

FIGS. 10A and 10B illustrate a seventh bracket 220_7 and FIGS. 11A and 11B illustrate an eight bracket 220_8. The brackets 220_7 and 220_8 comprises similar bracket attachment features 221_7 and 221_8 as one another, which are both configured to engage with bracket attachment features (not illustrated) of the fourth mounting location 210_4 to attach the bracket 220_7 or 220_8 to the fourth mounting location 210_4, as shown in FIG. 23 (only the bracket 220_7 is shown in FIG. 23, but the bracket 220_8 could be attached in a similar fashion at the same location). Thus, the seventh or eighth brackets 220_7 and 220_8 may be used in lieu of the fourth bracket 220_4, or vice versa. As shown in FIGS. 10A-11B, the bracket attachment features 221_7 and 221_8 comprise holes configured to align with holes in the fourth mounting location 210_4 and receive screws, bolts, or other mechanical fasteners therethrough.

As shown in FIGS. 10A and 10B, the seventh bracket 220_7 corresponds to the rear panel sections 250_3 or 252_4 and comprises a panel attachment feature 222b_7 configured to engage with complementary panel attachment features 252b_3 or 252b_4 on a right side of the rear panel sections 250_3 or 252_4 when the section is positioned to the left of the bracket 220_7. In this example, the panel attachment feature 222b_7 comprise a slot in a lateral vertical face of the bracket 220_7 (similar to attachment feature 222b_6 of bracket 220_6) and the complementary panel attachment features 252b_3 and 252b_4 comprise pins or studs that protrude laterally and are configured to be received in slot (see FIGS. 14, 15, 29, and 30). The seventh bracket 220_7 also corresponds to the rear panel sections 250_2, 252_9, and 250_10, and comprises panel attachment feature 222a_7 configured to engage with complementary panel attachment features 252a_2, 252a_9, or 252a_10 on the left of the rear panel sections 250_2, 252_9, and 250_10 when the section is positioned to the right of the bracket 220_7. The panel attachment feature 222a_7 comprises a slot in a lateral vertical face of the bracket 220_7, and the complementary panel attachment features 252a_2, 252a_9, or 252a_10 comprise protrusions (e.g., flanges, pins, studs, etc.) protruding laterally from a side of the rear panel sections 250_2, 252_9, and 250_10 and configured to be received in the slot. For example, the complementary panel attachment features 252a_9 is visible in FIG. 16 (the complementary panel attachment features 252a_2 and 252a_10 are not visible, but may be similarly configured).

As shown in FIGS. 11A and 11B, the eighth bracket 220_8 corresponds to the rear panel sections 250_5 and 252_6 and comprises a first panel attachment feature 222b_8 configured to engage with complementary panel attachment features 252b_5 or 252b_6 on the right side of the rear panel sections 250_5 or 252_6 when the section is positioned to the left of the bracket 220_8. In this example, the panel attachment feature 223b_8 comprise a hole in a lateral vertical face of the bracket 220_8 and the complementary panel attachment features 252b_5 and 252b_5 comprise screws or pins (e.g., spring loaded pins) that protrude laterally and are configured to be received in hole (see FIGS. 18, 19, 27, and 28). The eighth bracket 220_8 also corresponds to the rear panel section 250_1 and comprises a second panel attachment feature 222b_8 (see FIG. 11B) configured to engage with complementary panel attachment features 252b_1 on the right side of the rear panel section 250_1 when the rear panel section 250_1 is positioned to the left of the bracket 220_8, which has already been described above. Like the seventh bracket 220_7, the eighth bracket 220_8 also corresponds to the rear panel sections 250_2, 252_9, and 250_10, and comprises panel attachment feature 222a_8 configured to engage with complementary panel attachment features 252a_2, 252a_9, or 252a_10 on the left side of the rear panel sections 250_2, 252_9, and 250_10 when the section is positioned to the right of the bracket 220_8. The panel attachment feature 222a_8 is similar to the panel attachment feature 222a_7.

The second, third, and fourth brackets 220_2, 220_3, and 220_4 described above may also be referred to herein as reduced-height brackets, while the fifth, sixth, seventh, and eights brackets 220_5, 220_6, 220_7, and 220_8 may be referred to as full-height brackets. In some examples, brackets 220_2, 220_3, and 220_4 may be about one third the height of brackets 220_5, 220_6, 220_7, and 220_8. In some examples, the height of the reduced height brackets may be equal to about the height of one PCIe expansion slot, or in other words about 0.5 U (a U being a standard rack unit), and the height of the full height brackets may be equal to about the height of three PCIe expansion slots, or in other words about 1.5 U. In the illustrated example, the first supporting rear panel section 268_1 is also about 0.5 U, resulting in a total height of the chassis 280 of about 2 U for the illustrated example. Of course, it should be understood that this is merely one example, and other systems may have other dimensions, such as 1 U, 3 U, 4 U, or any other desired dimensions (e.g., including non-integer values of U).

Figure 12:
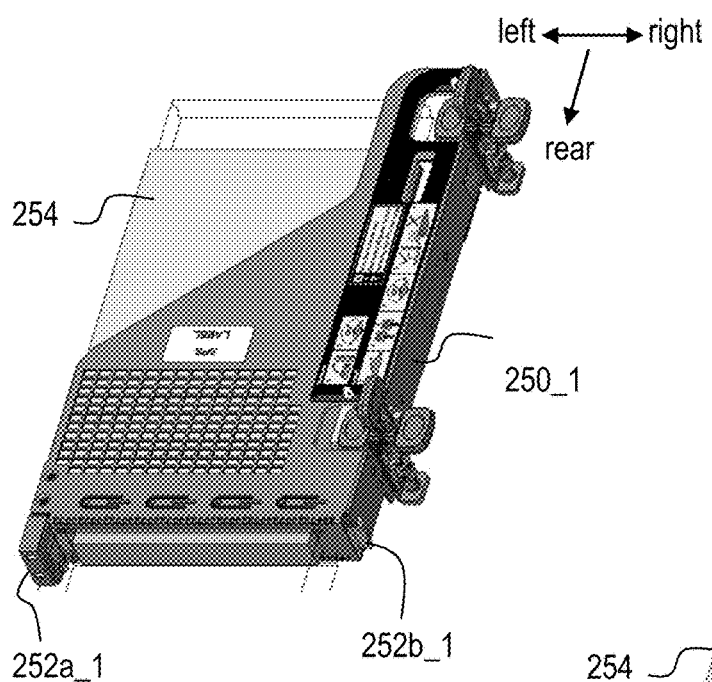
FIG. 12 is a perspective view of a modular rear panel section of the example modular rear panel system of FIG. 3.
Figure 13:
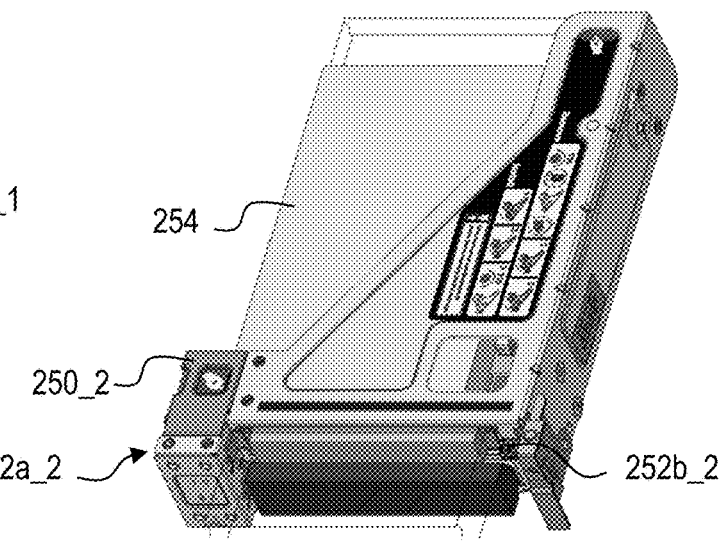
FIG. 13 is a perspective view of another modular rear panel section of the example modular rear panel system of FIG. 3.
Figure 14:
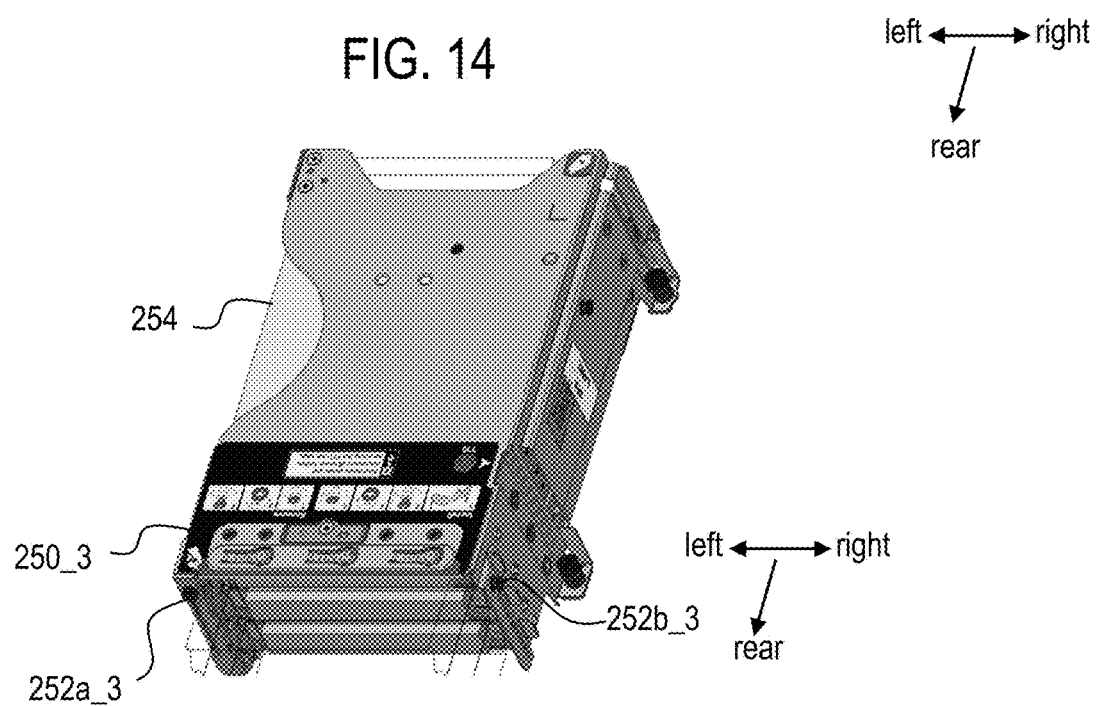
FIG. 14 is a perspective view of another modular rear panel section of the example modular rear panel system of FIG. 3.

FIGS. 12-14 illustrate rear panel sections 250_1, 250_2, and 250_3, which comprise expansion slot units (e.g., PCIe expansion slots) of varying size. The rear panel sections, 250_1, 250_2, and 250_3 each include cages configured to house one or more expansion devices such as PCIe expansion cards, graphics processing unit (GPU) cards, accelerators, or other expansion cards. The rear panel section 250_1 is a one-slot unit, meaning it comprises just one expansion slot (i.e., sufficient space for a single one-slot PCIe expansion card). The rear panel section 250_2 is a two-slot unit, meaning it has two expansion slots (i.e., sufficient space for two one-slot PCIe expansion cards or one two-slot PCIe expansion cards). The rear panel section 250_3 is a three-slot unit, meaning it has three expansion slots (i.e., sufficient space for three one-slot PCIe expansion cards, a two-slot card and a one-slot card, or one three-slot card). The rear panel sections 250_1, 250_2, and 250_3 are shown in FIGS. 12-15 with expansion cards 254 included therein for context, but in practice the expansion cards 254 may be provided separately from the rear panel sections 250. Each rear panel section 250_1, 250_2, and 250_3 may also comprise a perforated rear cover portion which is visible in FIGS. 24-32 but which is omitted in FIGS. 12-15. Each rear panel sections, 250_1, 250_2, and 250_3 includes panel attachment features 252 configured to engage with corresponding panel attachment features 222 as already described above.

In particular, as shown in FIGS. 12, the rear panel section 250_1 comprises an attachment feature 252a_1, in the form of a tab protruding horizontally rearward from rear panel section 250_1 at a left rear corner thereof, and an attachment feature 252a_1 in the form of a flange protruding laterally from the right rear corner. The attachment feature 252a_1 is configured to engage with attachment feature 222_2 of bracket 220_2 or attachment feature 222a_3 of bracket 220_3. The attachment feature 252b_1 is configured to engage with attachment feature 222b_3 of bracket 220_3 or attachment feature 222a_8 of bracket 220_8. FIGS. 24-28 illustrates some example configurations in which the rear panel section 250_1 is used. In these examples, two rear panel sections 250_1 are provided, one on a left side that is attached to the second and third brackets 220_1 and 220_3 and another on the right side that is attached to the third and eighth brackets 220_3 and 220_8.

As shown in FIG. 13, the rear panel section 250_2 comprises an attachment feature 252a_2 at the rear left corner thereof. Although not visible in FIG. 13, the attachment feature 252a_2 comprises a protrusion protruding laterally from a lateral face of the rear panel section 250_2, such as a flange, pin, or stud. For example, the attachment feature 252a_2 may be similar to the attachment feature 252a_9 shown in FIG. 16. The attachment feature 252a_2 is configured to engage with attachment feature 222a_7 of bracket 220_7 or attachment feature 222a_8 of bracket 220_8. The panel section 250_2 also comprises attachment feature 252b_2 at the rear right corner. The attachment feature 252b_2 comprises a screw or pin (e.g., spring loaded pin), and is configured to engage with a bracket 269. The bracket 269 may be attached to the right side lateral wall 283_2 of the chassis. The bracket 269 may be part of the modular rear panel system 100, but unlike the modular bracket 120 and 220, the bracket 269 is not selectively included or removed depending on the configuration of the electronic device; instead, in some examples, the bracket 269 may remain installed in all configurations of the electronic device. The bracket 269 may comprise a hole configured to receive the screw or pin of the attachment feature 252b_2. FIGS. 26-30 illustrate some example configurations in which the rear panel section 250_2 is used. In these examples, a single rear panel section 250_3 is provided and is positioned above a compartment for holding rear panel section 250_10 comprising power supply units.

As shown in FIG. 14, the rear panel section 250_3 comprises an attachment feature 252a_3 at the rear left corner thereof. The attachment feature 252a_3 comprises a pin or stud protruding rearward from a rear vertical face of the section 250_3. The attachment feature 252a_3 is configured to engage with attachment feature 222_5 of bracket 220_5 or attachment feature 222a_6 of bracket 220_6. The rear panel section 250_3 also comprises an attachment feature 222b_3. The attachment feature 222b_1 is configured to engage with attachment feature 222b_3 of bracket 220_3 or attachment feature 222a_8 of bracket 220_8. The attachment feature 252b_3 comprises a pin or stud protruding laterally from a lateral vertical face of the section 250_3. The attachment feature 252b_3 is configured to engage with attachment feature 222b_6 of bracket 220_6, attachment feature 222b_7 of bracket 220_7, or attachment feature 222b_8 of bracket 220_8. FIGS. 29-32 illustrates some example configurations in which the rear panel section 250_3 is used. In these examples, two rear panel sections 250_1 are provided, one on a left side that is attached to the fifth and sixth brackets 220_5 and 220_6 and another on the right side that is attached to the sixth and seventh brackets 220_6 and 220_7. It should be understood that in other examples a single rear panel section 250_3 could be provided (instead of providing two rear panel section 250_3), for example in combination with rear panel section 250_4.

Figure 15:
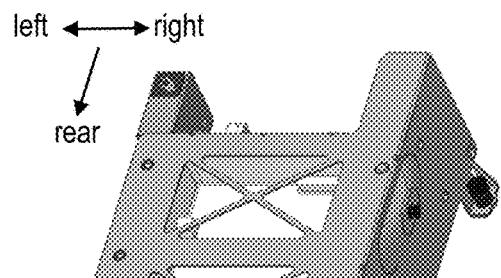
FIG. 15 is a perspective view of another modular rear panel section of the example modular rear panel system of FIG. 3.
Figure 28:
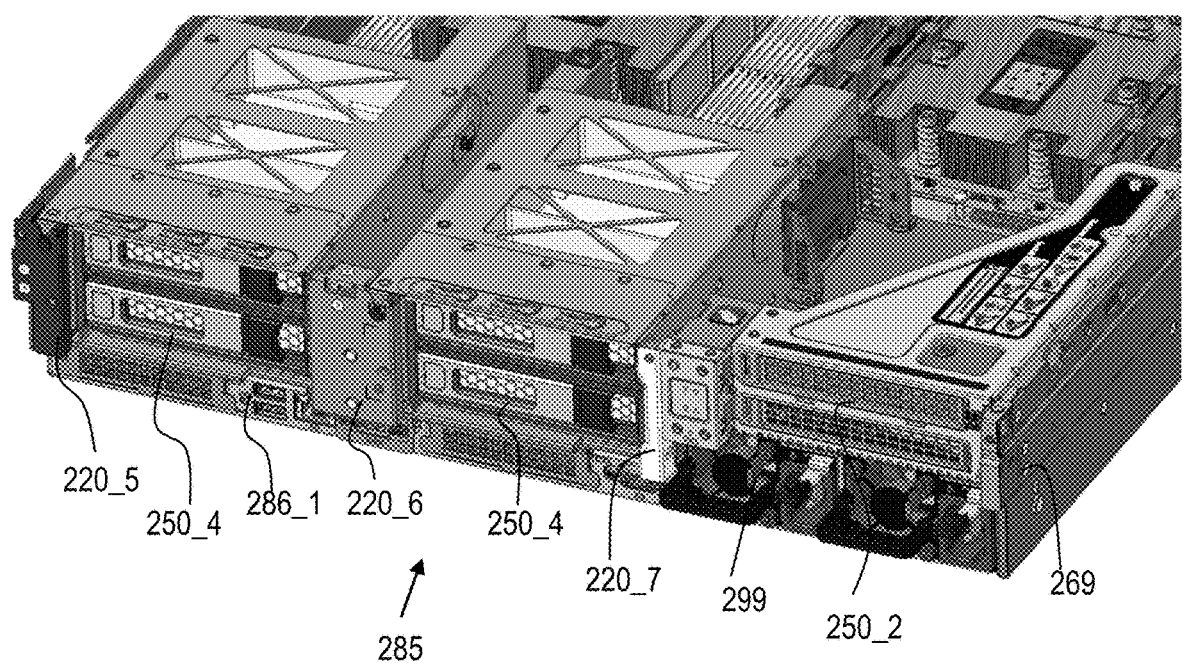
FIG. 28 is a perspective view of a portion an electronic device with a chassis having a fifth rear panel formed from a fifth combination of a third subset of the modular brackets and a fifth subset of the modular rear panel sections of the example modular rear panel system of FIG. 3.

FIG. 15 illustrates a rear panel section 250_4. The rear panel section 250_4 is a drive cage comprising two bays for holding large form factor (LFF) storage drives 255. LFF storage drives 255 are illustrated in FIG. 15 for context, but the LFF drives 255 may be provided seperately from the rear panel section 250_4. The rear panel section 250_4 has a similar size as the rear panel section 250_3 described above, and is configured to be coupled to the same brackets 220 as the rear panel section 250_3. Thus, the rear panel section 250_4 may be selected in lieu of the rear panel section 250_3 for any of the locations described above at which the rear panel section 250_3 can be disposed, or vice versa. The rear panel section 250_4 comprises attachment features 252a_4 and 252b_4 that are similar to the attachment features 252a_3 and 252b_3 described above. FIG. 28 illustrates one example configuration comprising the rear panel sections 250_4. It should be understood that other example configurations (not illustrated) could also include the rear panel section 250_4—for example, the rear panel section 250_4 could be substituted for one or both of the rear panel sections 250_3 in the configurations illustrated in FIGS. 29-32.

Figure 16:
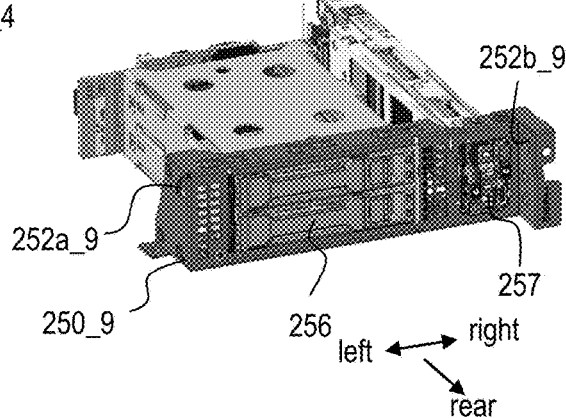
FIG. 16 is a perspective view of another modular rear panel section of the example modular rear panel system of FIG. 3.
Figure 31:
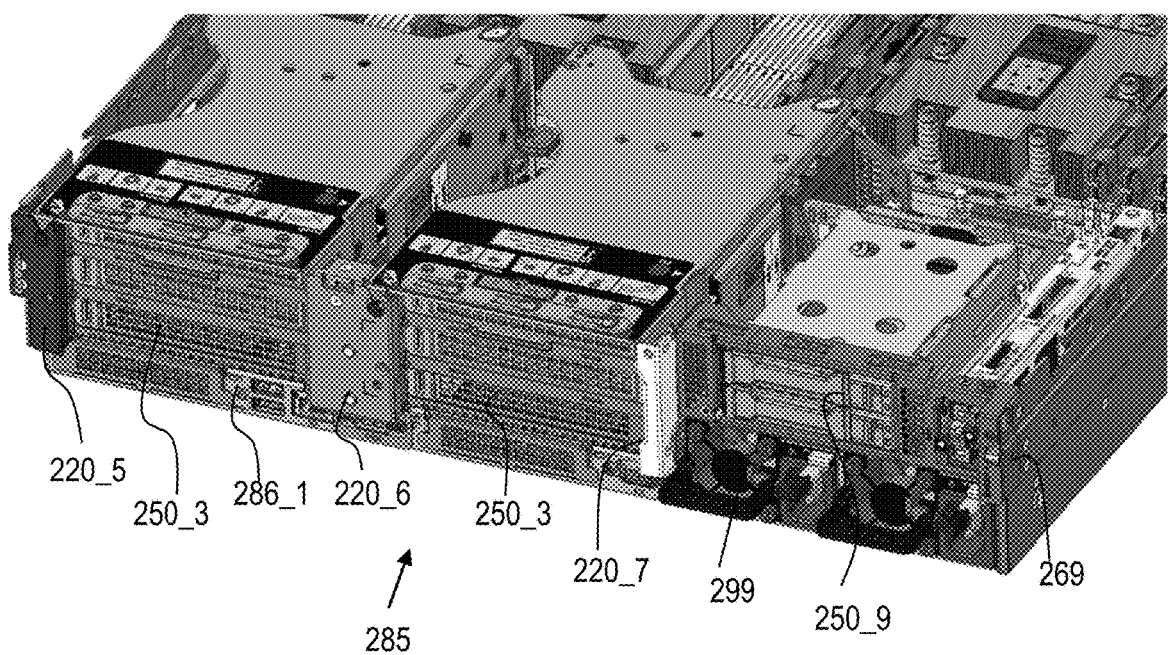
FIG. 31 is a perspective view of a portion an electronic device with a chassis having an eighth rear panel formed from an eighth combination of the third subset of the modular brackets and an eighth subset of the modular rear panel sections of the example modular rear panel system of FIG. 3.

FIG. 16 illustrates a rear panel section 250_9. The rear panel section 250_9 is a drive cage comprising two bays for holding small form factor (SFF) storage drives 256 and one bay for holding a boot drive 257. The drives 256 and 267 are illustrated in FIG. 16 for context, but the drives 256 and 267 may be provided seperately from the rear panel section 250_9. The rear panel section 250_9 has a similar size as the rear panel section 250_2 described above, and is configured to be coupled to the same brackets 220 as the rear panel section 250_2. Thus, the rear panel section 250_9 may be selected in lieu of the rear panel section 250_2 for any of the locations described above at which the rear panel section 250_2 can be disposed, or vice versa. The rear panel section 250_9 comprises attachment features 252a_9 and 252b_9. The attachment feature 252a_9 comprises a tab or other protrusion protruding laterally from a lateral vertical face of the section 250_9, and configured to engage with the attachment features 222a_7 or 222a_8 of the brackets 220_7 or 220_8. The attachment feature 252b_9 comprises a screw configured to engage with a hole in bracket 269. FIG. 31 illustrates one example configuration comprising the rear panel section 250_9. It should be understood that other example configurations (not illustrated) could also include the rear panel section 250_9—for example, the rear panel section 250_9 could be substituted for the rear panel sections 250_2 in the configurations illustrated in FIGS. 26-29.

Figure 17:
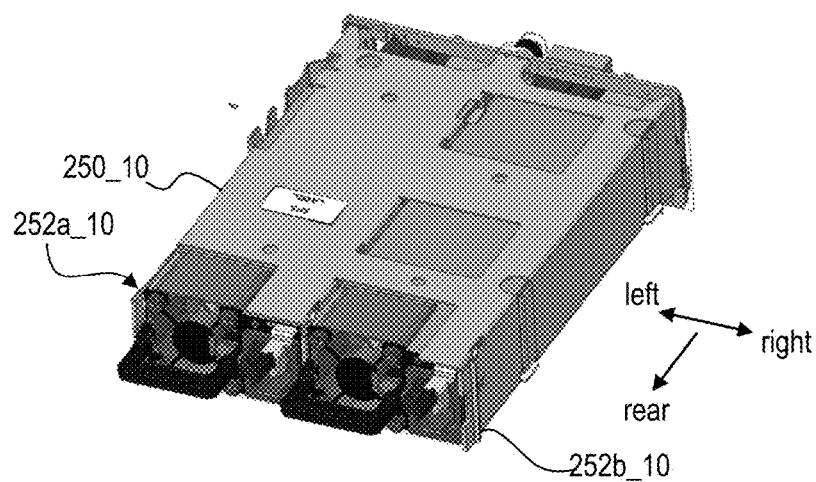
FIG. 17 is a perspective view of another modular rear panel section of the example modular rear panel system of FIG. 3.
Figure 18:
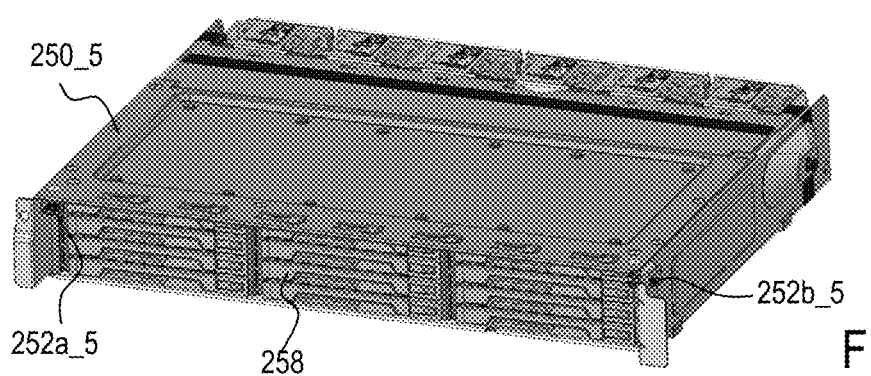
FIG. 18 is a perspective view of another modular rear panel section of the example modular rear panel system of FIG. 3.

FIG. 17 illustrates a rear panel section 250_10. The rear panel section 250_10 comprises a cage for housing a pair of power supply units (PSU). A pair of power supply units 299 is generally included in each configuration of the electronic device, with the PSUs 299 being housed within the second supporting rear panel section 268_2, which forms a power supply cage or housing. However, another power supply cage in the form of the rear panel section 250_10 may also be included in the system (e.g., for added redundancy and/or to provide increased power output), in which case rear panel section 250_10 may be coupled to the brackets 220 similar to the other rear panel sections 250. More specifically, the rear panel section 250_10 has a similar size as the rear panel sections 250_2 and 250_9 described above, and is configured to be coupled to the same brackets 220 as the sections 250_2 and 250_9. Thus, the rear panel section 250_10 may be selected in lieu of the rear panel section 250_2 or 250_9 for any of the locations described above at which the rear panel section 250_2 or 250_9 can be disposed, or vice versa. The rear panel section 250_10 comprises attachment features 252a_10 and 252b_10. The attachment feature 252a_10 and 252b_10 each comprises a tab or other protrusion protruding laterally from a lateral vertical face of the section 250_10 (only feature 252b_10 is visible, but feature 252a_10 may be similarly configured), and configured to engage with the attachment features 222c_7 or 222c_8 of the brackets 220_7 or 220_8. It should be understood that other example configurations (not illustrated) could also include the rear panel section 250_10—for example, the rear panel section 250_10 could be substituted for the rear panel sections 250_2 in the configurations illustrated in FIGS. 26-29.

Figure 19:
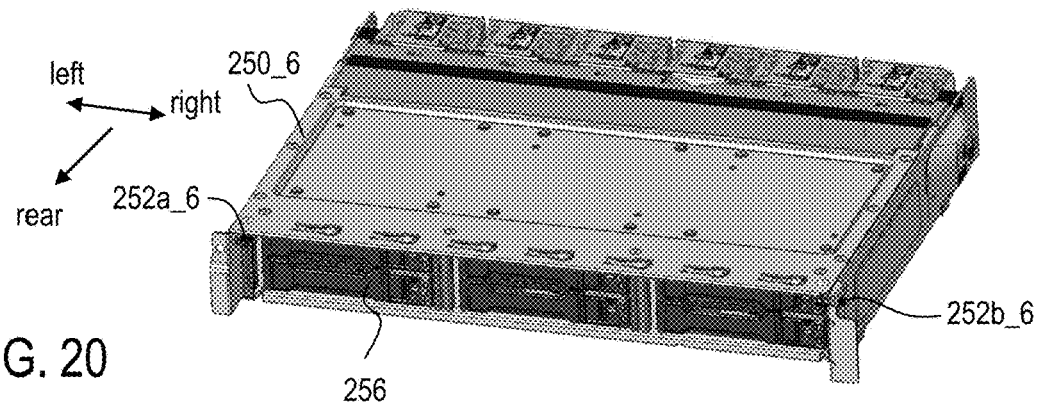
FIG. 19 is a perspective view of another modular rear panel section of the example modular rear panel system of FIG. 3.
Figure 20:
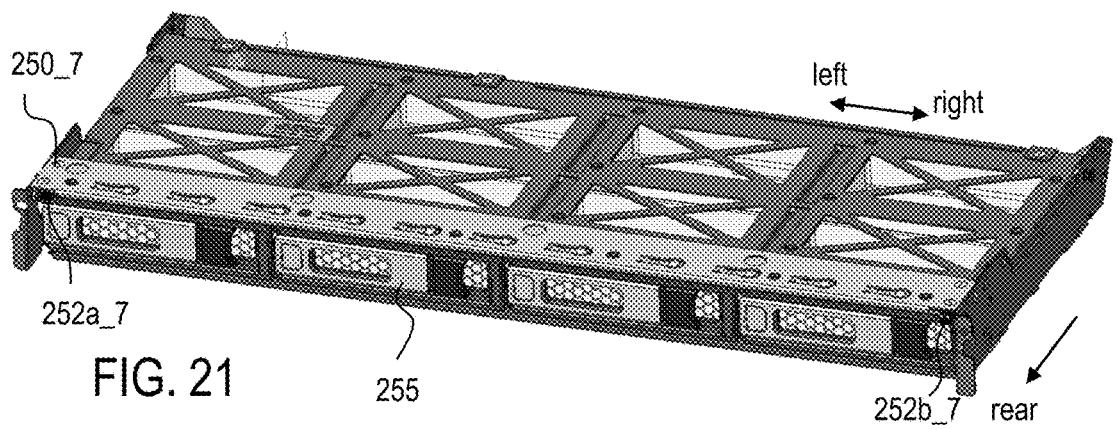
FIG. 20 is a perspective view of another modular rear panel section of the example modular rear panel system of FIG. 3.
Figure 21:
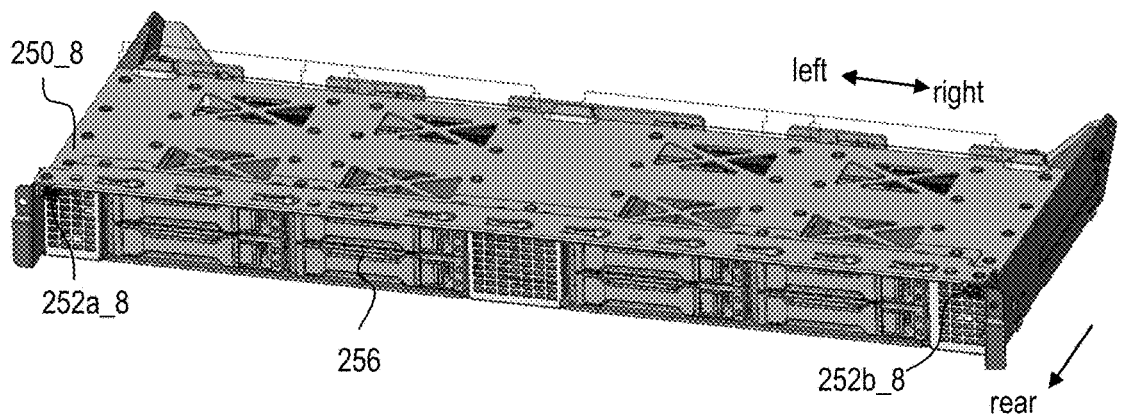
FIG. 21 is a perspective view of another modular rear panel section of the example modular rear panel system of FIG. 3.

FIGS. 19-21 illustrate rear panel sections 250_5, 250_6, 250_7, and 250_8, which comprise drive cages of varying size and for carrying varying types of drives. These drive cages each include a number of bays, each for holding a removable storage drive. Rear panel sections 250_5 and 250_6 extend part way across a width of the chassis 280 (in some examples, about two thirds of the width), while rear panel sections 250_7 and 250_8 extend fully across the width of the chassis 280. The rear panel section 250_5 comprises twelve bays for holding Enterprise Datacenter Small Form Factor (EDSFF) storage drives 258 (e.g., in a grid of three columns and four rows of bays). Rear panel section 250_6 comprises six bays for holding Small Form Factor (SFF) storage drives 256 (e.g., in a grid of three columns and two rows). Rear panel section 250_7 comprises four bays for holding Large Form Factor (LFF) storage drives 255 (e.g., in a single row). Rear panel section 250_7 comprises eight SFF storage drives 256 (e.g., in n a grid of four columns and two rows).

Each of the rear panel sections 250_5, 250_6, 250_7, and 250_8 comprises a first attachment feature 252a_5, 252a_6, 252a_7, and 252a_8, respectively, which comprises a screw extending laterally from a left side of the section and configured to engage with the attachment feature 222a_1 of the first bracket 220_1. Each of the rear panel sections 250_5, 250_6, 250_7, and 250_8 also comprises a second attachment feature 252b_5, 252b_6, 252b_7, and 252b_8, respectively, which comprises a screw extending laterally from a right side of the section. The second attachment features 252b_5, 252b_6 are configured to engage with the attachment feature 222b_8 of the bracket 220_8. The second attachment features 252b_7, 252b_8 are configured to engage with a hole in the bracket 269.

The rear panel section 250_1 is a one-slot unit, meaning it comprises just one expansion slot (i.e., sufficient space for a single one-slot PCIe expansion card). The rear panel section 250_2 is a two-slot unit, meaning it has two expansion slots (i.e., sufficient space for two one-slot PCIe expansion cards or one two-slot PCIe expansion cards). The rear panel section 250_3 is a three-slot unit, meaning it has three expansion slots (i.e., sufficient space for three one-slot PCIe expansion cards, a two-slot card and a one-slot card, or one three-slot card). The rear panel sections 250_1, 250_2, and 250_3 are shown in FIGS. 12-14 with expansion cards 254 included therein for context, but in practice the expansion cards 254 may be provided separately from the rear panel sections 250. Each rear panel section 250_1, 250_2, and 250_3 may also comprise a perforated rear cover portion which is visible in FIGS. 24-32 but which is omitted in FIGS. 12-14. Each rear panel sections, 250_1, 250_2, and 250_3 includes panel attachment features 252 configured to engage with corresponding panel attachment features 222 as already described above.

FIGS. 24-32 illustrates various example configurations of rear panels 285 of a chassis 280 that can be formed using the modular rear panel system 200 described above. Note that FIGS. 24-32 are not exhaustive of all the configurations of rear panels 285 that can be formed using the modular rear panel system 200. Note that each configuration includes at least one rear panel section 250_10 (power supply unit), first and second supporting rear panel section 286_1 and 286_2, and the bracket 269, and thus these components are not mentioned seperately in relation to each figure below to avoid repetition.

Figure 24:
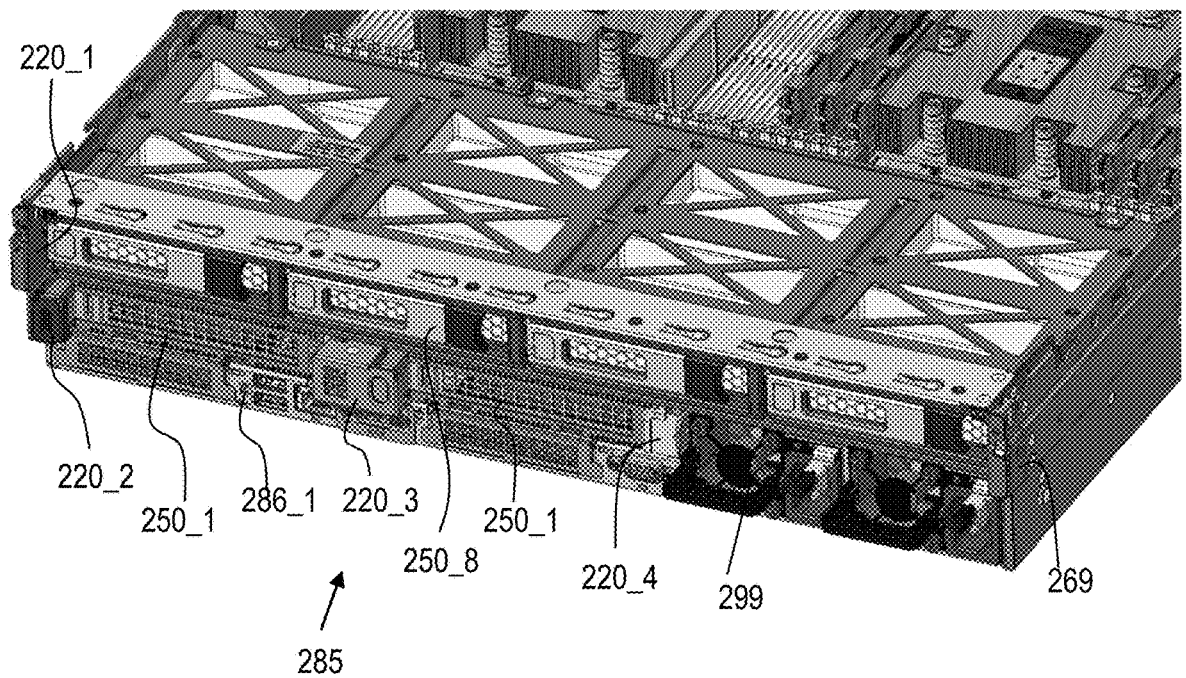
FIG. 24 is a perspective view of a portion an electronic device with a chassis having a first rear panel formed from a first combination of a first subset of the modular brackets and a first subset of the modular rear panel sections of the example modular rear panel system of FIG. 3.

FIG. 24 illustrates a first configuration of a rear panel 285 in which two rear panel sections 250_1 (one-slot expansion card units), and one rear panel section 250_8 (drive cage with four LFF drive bays) have been used. In addition, brackets 220_1, 220_2, 220_3, and 220_4 are used to attach the sections 250_and 250_8 to the remainder of the chassis 280.

Figure 25:
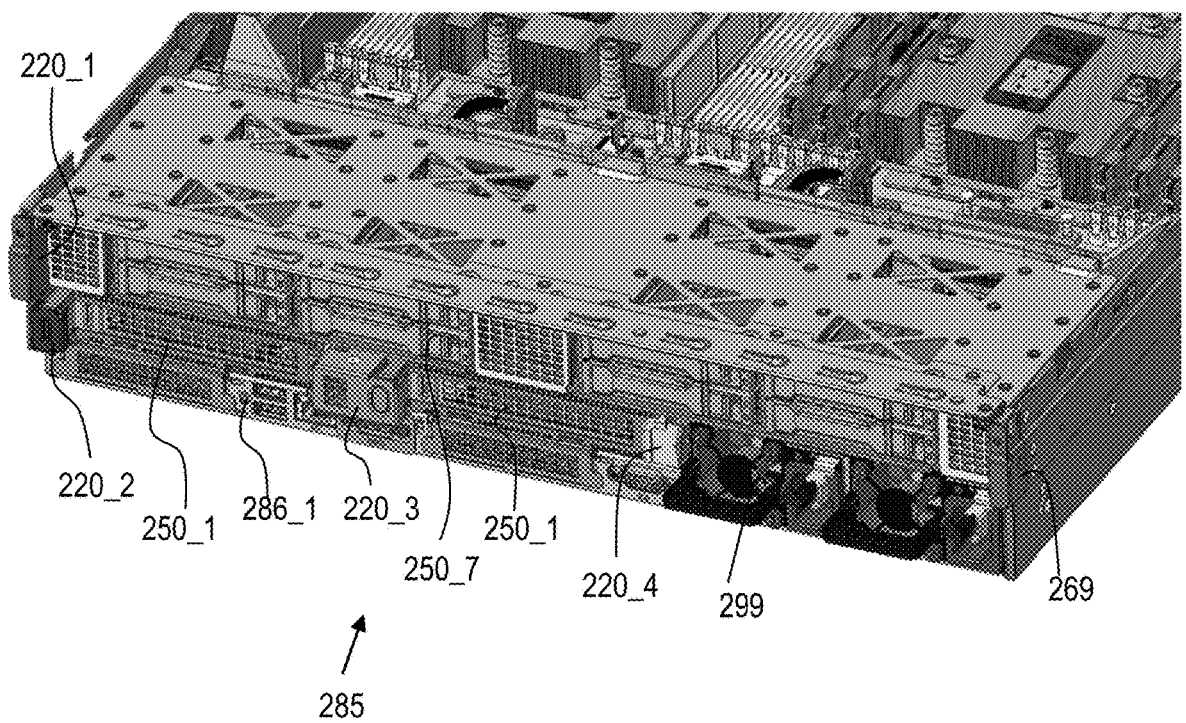
FIG. 25 is a perspective view of a portion an electronic device with a chassis having a second rear panel formed from a second combination of the first subset of the modular brackets and a second subset of the modular rear panel sections of the example modular rear panel system of FIG. 3.

FIG. 25 illustrates a second configuration of a rear panel 285 which is similar to the first configuration of FIG. 24 except that the rear panel section 250_7 (drive cage with eight SFF drive bays) has been substituted for the rear panel section 250_8.

Figure 26:
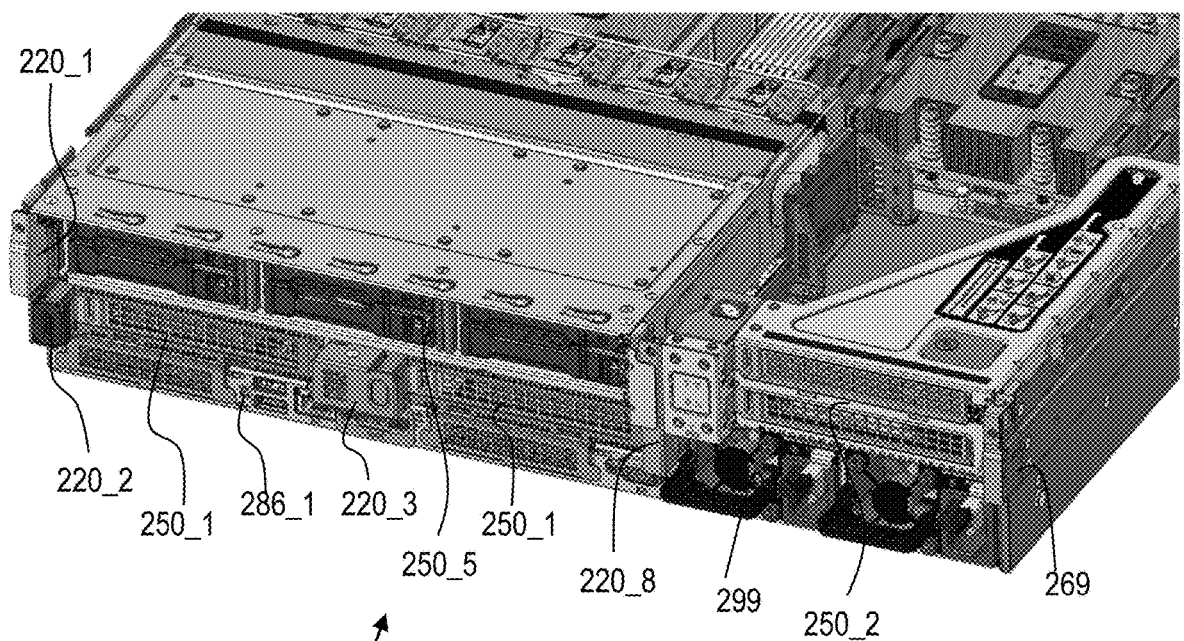
FIG. 26 is a perspective view of a portion an electronic device with a chassis having a third rear panel formed from a third combination of a second subset of the modular brackets and a third subset of the modular rear panel sections of the example modular rear panel system of FIG. 3.

FIG. 26 illustrates a third configuration of a rear panel 285 in which two rear panel sections 250_1 (one-slot expansion card units), one rear panel section 250_5 (drive cage with six SFF drive bays), and one rear panel section 250_2 (two-slot expansion card unit) have been used. In addition, brackets 220_1, 220_2, 220_3, and 220_8 are used to attach the sections to the remainder of the chassis 280. The brackets 220 used in the third configuration are similar to the brackets 220 used in the first and second configurations except that the bracket 220_8 has been substituted for the bracket 220_4.

Figure 27:
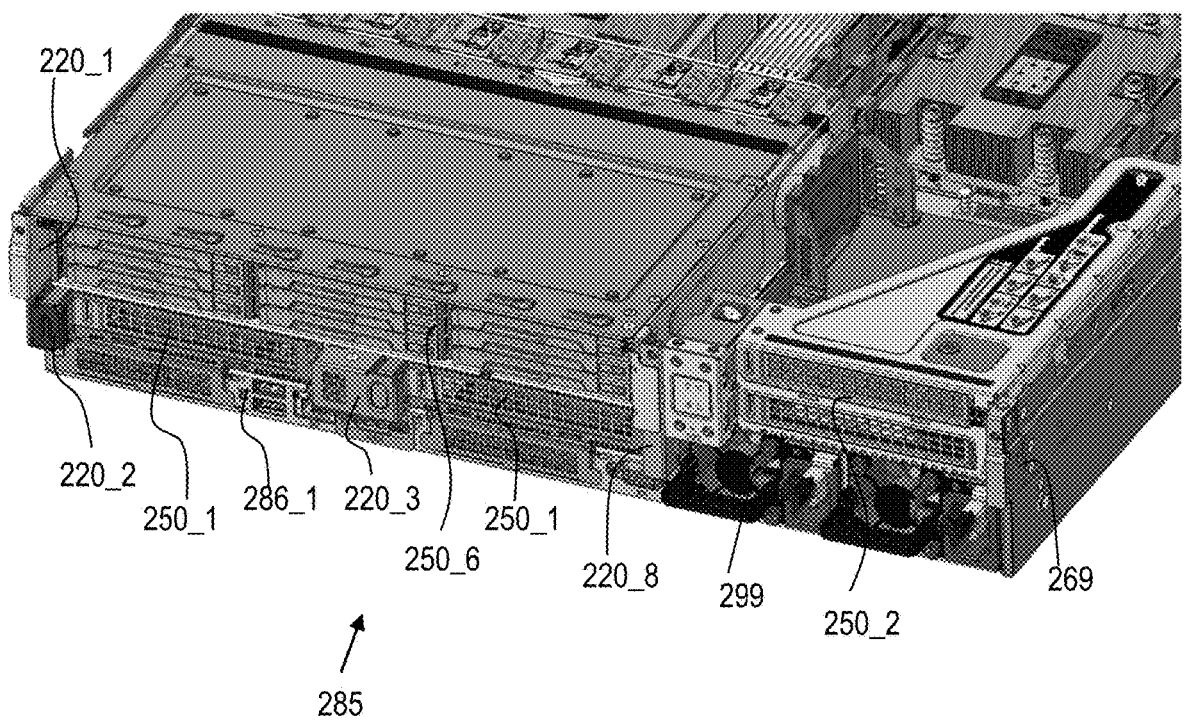
FIG. 27 is a perspective view of a portion an electronic device with a chassis having a fourth rear panel formed from a fourth combination of the second subset of the modular brackets and a fourth subset of the modular rear panel sections of the example modular rear panel system of FIG. 3.

FIG. 27 illustrates a fourth configuration of a rear panel 285 which is similar to the third configuration of FIG. 26 except that the rear panel section 250_6 (drive cage with twelve EDSFF drive bays) has been substituted for the rear panel section 250_5.

FIG. 28 illustrates a fifth configuration of a rear panel 285 in which two rear panel sections 250_4 (drive cages with two LFF drive bays) and one rear panel section 250_2 (two-slot expansion card unit) have been used. In addition, brackets 220_5, 220_6, and 220_7 are used to attach the sections to the remainder of the chassis 280. Comparing the fifth configuration to the first and second configurations, bracket 220_5 has been substituted for brackets 220_1 and 220_2, bracket 220_6 has been substituted for bracket 220_3, and bracket 220_7 has been substituted for bracket 220_4.

Figure 29:
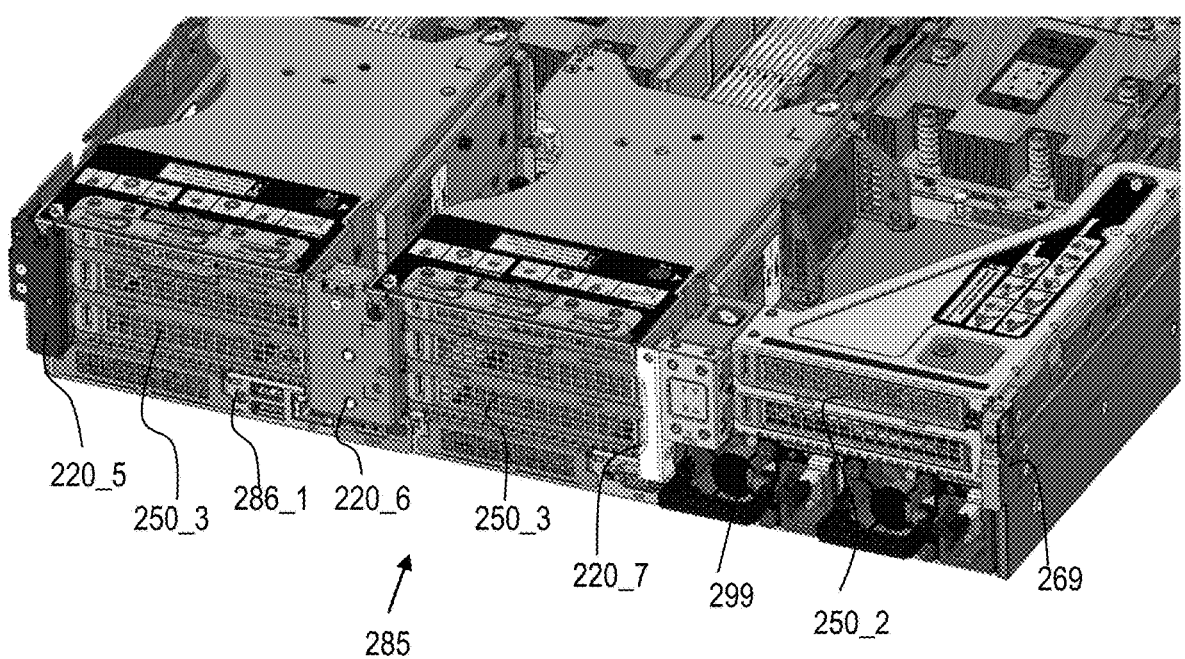
FIG. 29 is a perspective view of a portion an electronic device with a chassis having a sixth rear panel formed from a sixth combination of the third subset of the modular brackets and a sixth subset of the modular rear panel sections of the example modular rear panel system of FIG. 3.

FIG. 29 illustrates a sixth configuration of a rear panel 285 which is similar to the fifth configuration of FIG. 28 except that two rear panel section 250_3 (three-slot expansion card units) have been substituted for the two rear panel sections 250_4.

Figure 30:
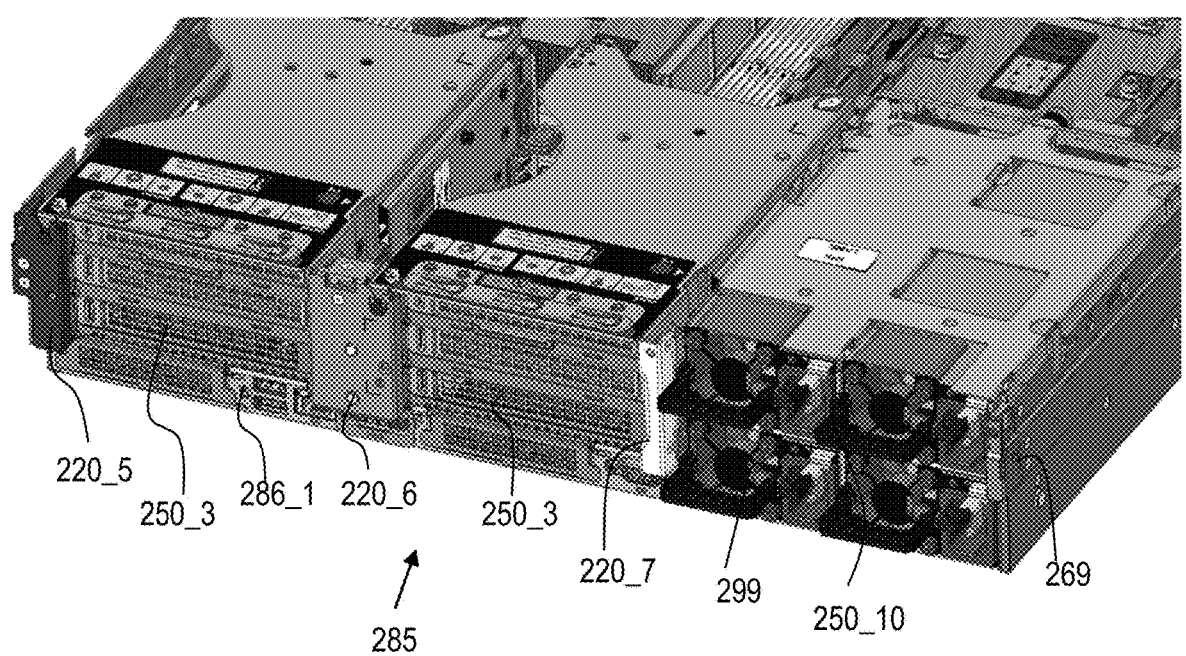
FIG. 30 is a perspective view of a portion an electronic device with a chassis having a seventh rear panel formed from a seventh combination of the third subset of the modular brackets and a seventh subset of the modular rear panel sections of the example modular rear panel system of FIG. 3.

FIG. 30 illustrates a seventh configuration of a rear panel 285 which is similar to the sixth configuration of FIG. 29 except that a rear panel section 250_10 (power supply unit) has been substituted for the rear panel section 250_2.

FIG. 31 illustrates an eighth configuration of a rear panel 285 which is similar to the sixth configuration of FIG. 29 except that a rear panel section 250_9 (drive cage with 2 SFF drive bays and a boot drive bay) has been substituted for the rear panel section 250_2.

Figure 32:
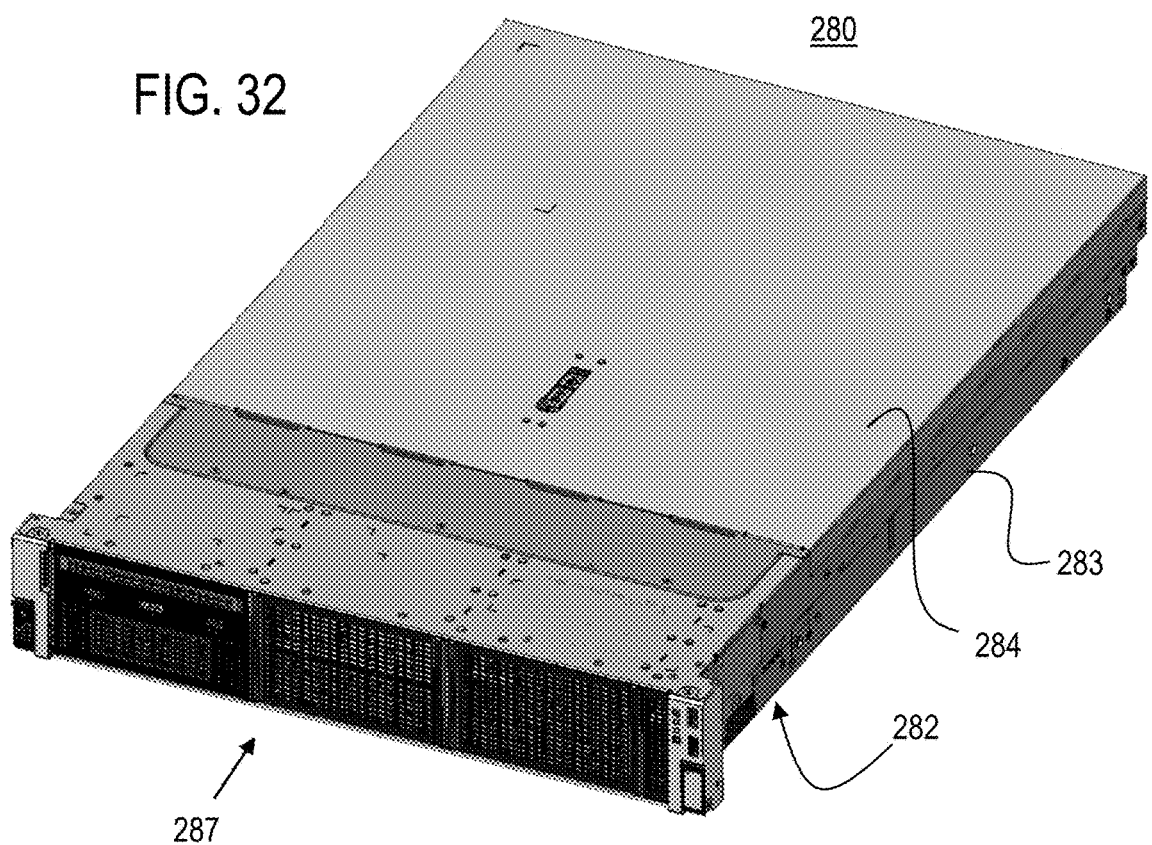
FIG. 32 is a perspective view of an electronic device and a chassis thereof.
Figure 33:
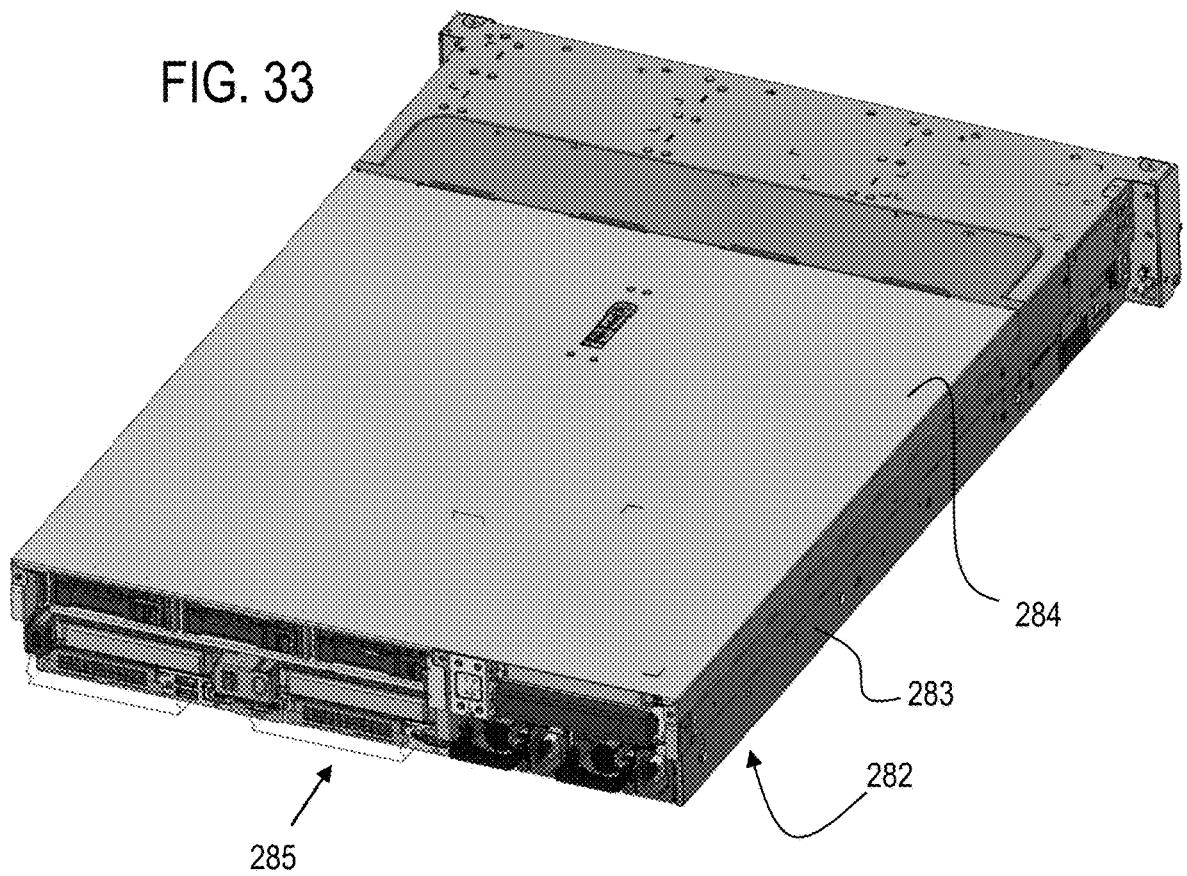
FIG. 33 is a perspective view of a portion the electronic device and chassis of FIG. 31 with a rear panel sections thereof formed from the example modular rear panel system of FIG. 3.

FIGS. 32 and 33 illustrate the chassis 280. As noted above, the chassis 280 comprises a base 282, two lateral walls 283 coupled to the base 282, and a top cover 284 coupled to the lateral walls 283. The chassis 280 also comprises a front panel 287 and a rear panel 285. The front panel 287 comprises one or more bays for removable devices (e.g., storage drives). The rear panel 285 is formed from the modular rear panel system 200, and has one of the rear panel configurations described above. The chassis 280 may house electronic components, such as a printed circuit board assembly, a processor, memory, storage devices, etc. The chassis 280 and the electronic components housed therein form an electronic device or system. The electronic device or system may be, for example, a server, a networking device, or some other electronic device.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

Further, spatial, positional, and relational terminology used herein is chosen to aid the reader in understanding examples of the implementations but is not intended to limit the implementation to a particular reference frame, orientation, or positional relationship. For example, spatial, positional, and relational terms such as "up", "down", "lateral", "beneath", "below", "lower", "above", "upper", "proximal", "distal", and the like may be used herein to describe directions or to describe one element's or feature's spatial relationship to another element or feature as illustrated in the figures. These spatial terms are used relative to reference frames in the figures and are not limited to a particular reference frame in the real world. Thus, for example, the direction "up" in the figures does not necessarily correspond to an "up" in a world reference frame (e.g., away from the Earth's surface). Furthermore, if a different reference frame is considered than the one illustrated in the figures, then the spatial terms used herein may need to be interpreted differently in that different reference frame. For example, the direction referred to as "up" in relation to one of the figures may correspond to a direction that is called "down" in relation to a different reference frame that is rotated 180 degrees from the figure's reference frame. As another example, if a device is turned over 180 degrees in a world reference frame as compared to how it was illustrated in the figures, then an item described herein as being "above" or "over" a second item in relation to the Figures would be "below" or "beneath" the second item in relation to the world reference frame. Moreover, the poses of items illustrated in the figure are chosen for convenience of illustration and description, but in an implementation in practice the items may be posed differently.

In addition, the singular forms "a," "an," and "the" are intended to include the plural forms as well, unless the context indicates otherwise. Moreover, the terms "comprises," "comprising," "includes," and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

Provide: As used herein, to "provide" an item means to have possession of and/or control over the item. This may include, for example, forming (or assembling) some or all of the item from its constituent materials and/or, obtaining possession of and/or control over an already-formed item.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}."

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the implementations disclosed herein. It is intended that the specification and examples be considered as exemplary only, with the following claims being entitled to their fullest breadth, including equivalents, under the applicable law.

What is claimed is:

1. A modular rear panel system for a chassis of an electronic device, comprising:
    a plurality of modular brackets, each configured to be selectively coupled to the chassis at a corresponding bracket mounting location of a plurality of bracket mounting locations; and
    a plurality of modular rear panel sections, each configured to be selectively coupled to one or more corresponding modular brackets of the plurality of modular brackets;
    wherein the plurality of modular brackets and the plurality of modular rear panel sections comprise a plurality of combinations, each comprising a subset of the modular rear panel sections and a subset of the modular brackets that can be assembled together to form a rear panel of the chassis with the subset of the modular brackets coupled to the plurality of mounting locations and the subset of the modular rear panel sections coupled to the subset of the modular brackets,
    wherein the rear panels formable from the plurality of combinations have mutually different rear panel configurations.

2. The modular rear panel system of claim 1,
    wherein each mounting location of the plurality of bracket mounting locations is configured to interchangeably receive two or more corresponding brackets of the plurality of modular brackets.

3. The modular rear panel system of claim 1,
    wherein the plurality of combinations comprises mutually different subsets of the plurality of modular rear panel sections; and
    wherein at least some of the plurality of combinations comprise mutually different subsets of the plurality of modular brackets.

4. The modular rear panel system of claim 1,
    wherein the plurality of modular brackets is configured to be removably coupled to the corresponding bracket mounting locations;
    wherein the plurality of modular rear panel sections is configured to be removably coupled to the corresponding modular brackets.

5. The modular rear panel system of claim 1,
wherein the plurality of modular rear panel sections comprises:
one or more rear panel sections that extend along a width dimension of the chassis across a full width of the chassis;
one or more rear panel sections that extend along the width dimension across less than the full width of the chassis; and
one or more rear panel sections that extend a first distance along a height dimension of the chassis; and
one or more rear panel sections that extend a second distance along the height dimension of the chassis, the second distance being less than the first distance.

6. The modular rear panel system of claim 5,
wherein the plurality of modular brackets comprises:
one or more brackets that extend the first distance along the height dimension; and
one or more rear panel sections that extend the second distance along the height dimension.

7. The modular rear panel system of claim 1,
wherein the plurality of modular rear panel sections comprises one or more removable device cages and one or more expansion slot units.

8. The modular rear panel system of claim 7,
wherein the plurality of modular rear panel sections comprises a power supply unit.

9. The modular rear panel system of claim 7,
wherein one or more removable device cages comprise a plurality of mutually different removable device cages.

10. The modular rear panel system of claim 9,
wherein the plurality of mutually different removable device cages differs from one another in size, numbers of bays to receive removable devices, and/or type of removable devices receivable in the removable device cage.

11. The modular rear panel system of claim 7,
wherein the one or more removable device cages comprise storage drive cages configured to removably receive storage devices.

12. The modular rear panel system of claim 7,
wherein the one or more expansion slot units differ from one another in size.

13. The modular rear panel system of claim 1,
wherein the plurality of modular brackets comprises at least two types of modular brackets that are mutually different from one another; and
wherein the plurality of modular rear panel sections comprises at least two types of modular rear panel section that are mutually different from one another.

14. The modular rear panel system of claim 1, further comprising:
wherein one or more modular brackets of the plurality of modular brackets are coupled to the chassis directly and one or more others of the plurality of modular brackets are coupled to the chassis indirectly via another structure coupled to the chassis.

15. The modular rear panel system of claim 1, further comprising:
a supporting rear panel section coupled to, or configured to be coupled to, the chassis, wherein a first mounting location of the plurality of bracket mounting locations is on the supporting rear panel section and one or more modular brackets of the plurality of modular brackets is configured to be coupled to the supporting rear panel section at the first mounting location.

16. A chassis for an electronic device comprising:
a base, two lateral walls coupled to the base, and a top cover; and
a rear panel formed from the modular rear panel system of claim 1 and comprising:
a subset of the plurality of modular brackets coupled to the base and/or one of the lateral walls, and
a subset of the plurality of modular rear panel sections coupled to the subset of the plurality of modular brackets.

17. An electronic device comprising:
the chassis of claim 16; and
one or more electronic components housed in the chassis, wherein at least some of the electronic components are housed within the subset of the plurality of modular rear panel sections.

18. A chassis for an electronic device comprising:
a base, two lateral walls coupled to the base, and a top cover; and
a rear panel comprising:
a plurality of mounting locations on the base, one of the lateral walls, and/or on a structure coupled to the base, each of the mounting locations comprising a first bracket attachment feature;
a first set of modular brackets removably coupled to the base and/or one of the lateral walls at the plurality of mounting locations, each of the modular brackets comprising a second bracket attachment feature configured to removably engage with the first bracket attachment feature; and
a first set of modular rear panel sections removably coupled to the first set of modular brackets.

19. The chassis of claim 18,
wherein a second set of modular brackets, having at least one member different from the first set of modular brackets, is couplable to the plurality of mounting locations in lieu of the first set of modular brackets; and
wherein a second set of modular rear panel sections, having at least one member different from the first set of modular rear panel sections, is couplable to the second set of modular brackets.

20. A method of assembling a rear panel for a chassis of an electronic device, comprising:
providing a modular rear panel system comprising modular brackets and modular rear panel sections, the modular brackets comprising at least two types of modular brackets that are mutually different and the modular rear panel sections comprising at least two types of modular rear panel sections that are mutually different;
selecting a subset of the modular rear panel sections;
selecting a subset of the modular brackets that corresponds to the selected subset of the modular rear panel sections;
attaching the selected subset of the modular brackets to a wall of the chassis at a plurality of mounting locations, each of the plurality of mounting locations being capable of receiving different ones of the modular brackets other than the selected subset of the modular brackets; and
attaching the selected subset of the modular rear panel sections to the selected subset of the modular brackets.

\* \* \* \* \*